(12) United States Patent
Aono et al.

(10) Patent No.: US 6,177,713 B1
(45) Date of Patent: Jan. 23, 2001

(54) FREE WHEEL DIODE FOR PREVENTING DESTRUCTION OF A FIELD LIMITING INNERMOST CIRCUMFERENTIAL LAYER

(75) Inventors: Shinji Aono; Masana Harada, both of Hyogo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/241,088

(22) Filed: Feb. 1, 1999

(30) Foreign Application Priority Data

Jul. 29, 1998 (JP) .................................. 10-213891

(51) Int. Cl.⁷ .................................................. H01L 23/58
(52) U.S. Cl. ...................... 257/490; 257/170; 257/409; 257/494; 257/495
(58) Field of Search .................... 257/490, 494, 257/495, 127, 128, 170, 409, 484, 605, 577

(56) References Cited

U.S. PATENT DOCUMENTS

| | | | |
|---|---|---|---|
| 4,587,547 | * 5/1986 | Amemiya et al. | 257/657 |
| 4,602,266 | * 7/1986 | Coe | 257/489 |
| 5,552,625 | * 9/1996 | Murakami et al. | 257/409 |
| 5,969,400 | * 10/1999 | Shinohe et al. | 257/492 |

FOREIGN PATENT DOCUMENTS

| | | | |
|---|---|---|---|
| 58-151068 | * 9/1983 | (JP) | 257/495 |
| 59-150471 | * 8/1984 | (JP) | 257/495 |
| 1-91475 | 4/1989 | (JP) . | |
| 3-222475 | * 10/1991 | (JP) | 257/495 |
| 4-364079 | 12/1992 | (JP) . | |
| 7-249737 | 9/1995 | (JP) . | |

OTHER PUBLICATIONS

"Improvement of the Diode Characteristics Using Emitter-–Controlled Principles (EMCON–Diode)", A. Porst et al., 1997 IEEE, pp. 213–216.

"3.3 kV IGBT Modules having Soft Recovery Diodes with High Reverse Recovery di/dt Capability (HiRC)", M. Nagasu et al., PCIM Inter '98 Japan Procceedings, pp. 175–178.

* cited by examiner

*Primary Examiner*—Olik Chaudhuri
*Assistant Examiner*—Hoai Pham
(74) *Attorney, Agent, or Firm*—McDermott, Will & Emery

(57) ABSTRACT

An anode electrode metal layer composed of aluminum is formed in a region on the inner side than an anode layer formed on a main surface of a semiconductor substrate. Thus, an impurity diffusion region from the innermost circumferential surface of said surface of field limiting innermost circumferential layer to the outermost circumferential surface of the anode electrode metal layer may be used as an electrical resistance. As a result, the hole density distributed from the bottom side of the field limiting innermost circumferential layer to a cathode layer when forward bias is applied may be reduced. As a result, when a reverse bias is applied, locally great recovery current passed from a cathode layer to the bottom of field limiting innermost circumferential layer may be restrained. Therefore, a diode capable of preventing destruction of a field limiting innermost circumferential layer when a reverse bias is applied may be provided.

9 Claims, 17 Drawing Sheets

FREE WHEEL DIODE FOR PREVENTING DESTRUCTION OF A FIELD LIMITING INNERMOST CIRCUMFERENTIAL LAYER

BACKGROUND OF THE INVENTION

1. Field of the Invention

The present invention relates generally to semiconductor devices, and more particularly, to a free wheel diode having field limiting layer, used as an intelligent power module.

2. Description of the Background Art

Free wheel diodes (hereinafter referred to as "FWD") have been conventionally used as an intelligent power module. The operation of such an FWD 200 in a half bridge circuit 400 as shown in FIG. 27 for simulation evaluation of the FWD will be described by way of illustration. The on/off of the half bridge circuit is controlled by an Insulated Gate Bipolar Transistor (hereinafter referred to as "IGBT") 210. When a waveform as shown in FIG. 28 for example is transmitted from a power supply to IGBT 210, IGBT 210 turns on from an off state. At this time, the waveforms of current and voltage between nodes 0 and 1 and the waveforms of current and voltage between nodes 1 and 2 are as shown in FIGS. 29 and 30, respectively. When IGBT 210 is off, a forward bias is applied to FWD 200, while when IGBT 210 is on, a reverse bias is applied to FWD 200. When the turning on completes, FWD 200 continues to be provided with a high reverse bias voltage.

The internal state of FWD 200 when the high reverse bias voltage is applied will be described by referring to FIGS. 16 to 26. FIG. 16 is a plan view of a conventional FWD, and a cross section thereof taken along line x—x is given in FIG. 17. The structure of the conventional FWD will be now described by referring to FIGS. 16 and 17.

The conventional FWD has an anode layer 103 provided in the center of a main surface of a semiconductor substrate 101 in the surface of the semiconductor substrate viewed from the side of an anode electrode. A field limiting innermost circumferential layer 104 is provided around anode layer 103. A plurality of annular field limiting layers 105 at prescribed distances outwardly from and surrounding field limiting innermost circumferential layer 104 are formed such that annular field limiting layers 105 gradually increase their sizes outwardly. A stopper channel 106 is provided at the utmost circumference of semiconductor substrate 101.

As shown in FIG. 17, in the cross section taken along line x—x in FIG. 16, n-type semiconductor substrate 101 having a width $w_2$ of 5600 $\mu$cm and a thickness t of 500 $\mu$m includes a cathode layer 102, an n-type impurity diffusion region formed from the bottom side of semiconductor substrate 101 to a prescribed thickness and having a concentration higher than semiconductor substrate 101, and an anode layer 103, p-type impurity diffusion region having a surface concentration of $5\times10^{16}$/cm$^3$ and width $w_3$ of 3450 $\mu$m and formed from about the center of the main surface on the top side of semiconductor substrate 101 to a position at a prescribed distance and at the diffusion depth of 6 $\mu$m from the main surface on the top side.

There is formed, on the main surface on the top side of semiconductor substrate 101, a field limiting innermost circumferential layer 104, an annular p-type impurity diffusion region two-dimensionally surrounding anode layer 103, formed deeper than anode layer 103, and having a diffusion depth of 10 $\mu$m from the main surface on the top side, a diffusion concentration of $1\times10^{19}$/cm$^3$ higher than anode layer 103, and a width $w_4$ of 50 $\mu$m. A plurality of field limiting layers 105, a group of annular p-type impurity diffusion regions when viewed two-dimensionally, formed at prescribed distances outwardly from field limiting innermost circumferential layer 104 and having the same concentration as field limiting innermost circumferential layer 104. A stopper channel layer 106, an n-type impurity diffusion region having a concentration higher than semiconductor substrate 101 is provided at the outermost circumference of semiconductor substrate 101.

There are provided a metal layer 107 for cathode electrode (hereinafter cathode electrode metal layer 107) composed of gold (Au) or the like, adjacent to cathode layer 102, and a metal layer 108 for anode electrode (hereinafter anode electrode metal layer 108) composed of aluminum, adjacent to anode layer 103 and having a width $w_1$ of 3450 $\mu$m.

A forward bias is applied to this FWD if IGBT 210 serving as a switch in half bridge circuit 400 is off, and therefore a positive potential is applied to anode electrode metal layer 108, and a negative potential is applied to cathode electrode metal layer 107. Thus, in the cross section taken along D—D in FIG. 17, a current passed from anode layer 103 toward cathode layer 102, and a current passed from p-type anode layer 103 to cathode layer 102 via field limiting innermost circumferential layer 104 are generated. The current density distribution and the positive hole density distribution inside the device at this time are given in FIGS. 19 and 20, respectively. When a reverse bias is applied, in other words, a positive potential in view of the potential of anode electrode metal layer 108 as a reference potential is applied to cathode metal layer 107, the equipotential surface gradually extends from one field limiting layer 105 to another gradually outwardly from field limiting innermost circumferential layer 104 as the potential increases and electric field concentration in the vicinity of the surface of semiconductor substrate 101 may be relaxed.

At this time, as can be seen from the current density distribution in FIG. 19, a region having a higher current density than its periphery appears from $3\times10^3$ $\mu$m to $4\times10^3$ $\mu$m in the abscissa representing distance x from line B—B in the plan view of the FWD in FIG. 17, in other words, at the bottom side portion of field limiting innermost circumferential layer 104. This is because p-type field limiting innermost circumferential layer 104 having a high density is provided at the position at a distance in the range from $3\times10^3$ $\mu$m to $4\times10^3$ $\mu$m from line B—B in FIG. 17 as shown in FIG. 20, and the hole density is large as a result. The resistance value of n-type semiconductor substrate 101 at the bottom side part of field limiting innermost circumferential layer 104 is thus reduced, which more easily allows a current therethrough.

Field limiting innermost circumferential layer 104 is provided for preventing the concentration of electric field at the outermost circumferential part of anode layer 103 when a reverse bias is applied, and as shown in FIGS. 21 and 22, the larger the radius of curvature of an end of field limiting innermost circumferential layer 104, the larger will be the distribution of charges along the circumference, so that the concentration of electric field is less likely. In order to increase the radius of curvature of field limiting innermost circumferential layer 104, an impurity must be implanted from the main surface of semiconductor substrate 101 to a position deeper than anode layer 103 as shown in FIG. 23. Furthermore, in order to shorten time required for the step of diffusing the impurity, the concentration of impurity to be implanted is sometimes increased, or the impurity is sometimes implanted such that the width $w_5$ of a region overlapping anode layer 103 is large as shown in FIG. 24 rather than small width $w_5$ as shown in FIG. 23. If the radius of curvature of the pn junction between field limiting innermost circumferential layer 104 and semiconductor substrate 101 is small, interspaces 111 between the equipotential surfaces are narrow and electric fields concentrate therearound. As a result, as shown in FIG. 26, an impurity must be implanted perpendicularly to the surface of semiconductor substrate 101 over a wide range, in order to increase the radius of curvature of the pn junction plane between field limiting innermost circumferential layer 104 and semiconductor substrate 101, and interspaces112 between equipotential surfaces should be increased. Hence, the concentration of the impurity in field limiting innermost circumferential layer 104 is considerably larger than that of anode layer 103.

FWD 200 is however switched from the state with a forward bias to the state with a reverse bias when IGBT 210 serving as a switch for the half bridge circuit is switched from an off state to an on state. At this time, a negative potential is applied to anode layer 103 in view of the potential of cathode electrode 102 as a reference potential, and the holes having position charges passed from the side of anode layer 103 to the side of cathode layer 102 in semiconductor substrate 101 are flowed back toward anode layer 103. At this time, the current from the bottom side of field limiting innermost circumferential layer 104 toward cathode layer 102 is flowed back toward anode layer 103 and field limiting innermost circumferential layer 104. At this time, a recovery current passed from the inside of semiconductor substrate 101 toward field limiting innermost circumferential layer 104 is flowed back locally in a great density. As a result, the temperature rises in the vicinity of field limiting innermost circumferential layer 104, and field limiting innermost circumferential layer 104 could be destroyed.

SUMMARY OF THE INVENTION

It is a object of the present invention to provide an FWD which can restrict destruction by heat in a field limiting innermost circumferential layer caused by a temperature rise in the vicinity of the field limiting innermost circumferential layer by a locally greatly flowing recovery current, a reverse bias is applied in a switching operation.

A semiconductor device according to one aspect of the present invention includes a semiconductor substrate of a first conductivity type, a first impurity diffusion region of a second conductivity type, formed from a first main surface of the semiconductor substrate to a prescribed depth, annular second impurity diffusion regions of the second conductivity type formed at prescribed intervals at the first main surface in a region outside the first impurity diffusion region to surround the first impurity diffusion region and having a depth from the first main surface greater than the first impurity diffusion region and a concentration higher than the first impurity diffusion region, a first metal layer provided on the first main surface of the semiconductor substrate in contact with the first impurity diffusion region in the region inside at a prescribed distance from the innermost circumference of the second impurity diffusion region, and a second metal layer provided in contact with a second main surface of the semiconductor substrate.

Thus, a prescribed distance is provided between the outermost circumferential surface of the first metal layer and the innermost circumference surface of the second impurity diffusion region on the first main surface of the semiconductor substrate. Thus, when a forward bias is applied, in other words, when a positive potential is applied to the first metal layer in view of the potential of the second metal layer as a reference potential, and a negative potential is applied to the second metal layer in view of the potential of the first metal layer as a reference potential, the part in the vicinity of the outer periphery of the impurity diffusion region provided at the first main surface of the semiconductor substrate from the first main surface of the semiconductor substrate between the outermost circumferential surface of the first metal layer and the innermost circumferential surface of the second impurity region to a prescribed depth serves as a resistance to prevent current generated under the first metal layer from being flowed toward the second impurity diffusion region. As a result, as compared to the case in which the first metal layer is formed large enough to be in direct contact with the second impurity diffusion region, the density of current passed from the lower side of the second impurity diffusion region toward the second metal layer may be reduced when a reverse bias is applied in a switching operation, in other words, when a negative potential is applied to first metal layer in view of the potential of the second metal layer as a reference potential and a positive potential is applied to the second metal layer in view of the potential of the first metal layer as a reference potential. During recovery at the time of the switching operation, if a reverse bias is applied, the concentration of current based on the uneven operation of locally large recovery current generated between the second impurity diffusion region and the second metal layer may be prevented. As a result, destruction by heat in the vicinity of the second impurity diffusion region caused by the temperature increase in the vicinity by the recovery current may be restrained.

In the semiconductor device according to the present invention, the outermost circumference of the first impurity diffusion region is provided at a prescribed distance apart from the innermost circumference of the second impurity diffusion region, and a third metal layer in contact with the outermost circumference of the first metal layer to surround the first metal layer is preferably provided on the first main surface of the semiconductor substrate through an insulating film formed to surround the first metal layer.

Thus, since the semiconductor substrate of the first conductivity type is presented between the first impurity diffusion region and the second impurity diffusion region of the second conductivity type, and therefore when a forward bias is applied, in other words, a positive potential is applied to the first metal layer in view of the potential of the second metal layer as a reference potential, and a negative potential is applied to the second metal layer in view of the potential of the first metal layer as a reference potential, current flowed from the first impurity diffusion region to the second impurity diffusion region is blocked by the semiconductor substrate of the first conductivity type. As a result, the current is not passed to the second impurity diffusion region.

As a result, the density of holes generated at the bottom side of the second impurity diffusion region is reduced. Hence, the concentration of current based on the uneven operation of recovery current flowed toward the second metal layer through the portion immediately below the second impurity diffusion region may be restrained. Therefore, when a reverse bias is applied during recovery in a switching operation, in other words, when a negative potential is applied to the first metal layer in view of the potential of the second metal layer as a reference potential and a positive potential is applied to the second metal layer in view of the potential of the first metal layer as a reference potential, the concentration of current based on the uneven operation of locally large recovery current generated between the second impurity diffusion region and the second metal layer may be restrained. As a result, destruction by heat in the vicinity of the second impurity diffusion region caused by the temperature rise in the vicinity by the recovery current may be restrained.

The third metal layer serves as a field plate layer, the concentration of electric field generated in the vicinity of the first main surface of the semiconductor substrate between the first and second impurity diffusion regions may be relaxed.

Further preferably, the semiconductor device according to the present invention may include an insulating layer provided at a prescribed distance such that the outermost circumference of the first impurity diffusion region is not in contact with the innermost circumference of the second impurity diffusion region, and covering a region on the first main surface of the semiconductor substrate between the outermost circumference of the first impurity diffusion region and innermost circumference of the second impurity diffusion region, and a conductive layer which connects the first impurity diffusion region and the second impurity diffusion region.

Thus, the conduction between the first and second impurity diffusion regions of the second conductivity type is disconnected by the semiconductor substrate of the first conductivity type. Thus, when a forward bias is applied, in other words, when a positive potential is generated at the first metal layer in view of the potential of the second metal layer as a reference potential, the flow of charges at the substrate surface in the second impurity diffusion region is reduced, and charges are sent to the second impurity diffusion region through the conductive layer. At this time, if the resistance value of the conductive layer is set at a large level, the amount of charges flowed to the second impurity diffusion layer is reduced. Thus, when a forward bias is applied, in other words, a positive potential is applied to the first metal layer in view of the potential of the second metal layer as a reference potential, and a negative potential is applied to the second metal layer in view of the potential of the first metal layer as a reference potential, the density of current passed toward the second metal layer from the second impurity diffusion region may be reduced.

Furthermore, there is provided a conductive layer connecting the first and second impurity diffusion regions through an insulating film on the first main surface of the semiconductor substrate. The conductive layer serves to pull the potential of the second impurity diffusion region close to the potential of the first impurity diffusion region when a reverse bias is applied. Thus, the potential difference between the first and second impurity diffusion regions is reduced, and therefore the concentration of an electric field in the region therebetween may be relaxed. As a result, when a reverse bias is applied, the concentration of current based on the uneven operation of locally great recovery current passed between the second impurity diffusion region and the second metal layer may be restrained. As a result, the destruction by heat in the vicinity of the second impurity diffusion region caused by the temperature rise in the vicinity may be restrained.

Further preferably, the semiconductor device according to the present invention may include a third impurity diffusion region of the first conductivity type provided two-dimensionally in contact with the inside of the second impurity diffusion region between the first and second impurity diffusion regions, wherein the first and second impurity diffusion regions are in contact with each other, and the third impurity diffusion region has an impurity diffusion depth smaller than the first impurity diffusion region.

Thus, the third impurity diffusion region of the first conductivity type is formed between the first and second impurity regions, a part of the first impurity diffusion region immediately below the third impurity diffusion region serves as a resistance against current passed from the first impurity diffusion region to the second impurity diffusion region, when a forward bias is applied, in other words, a positive potential is applied to the first metal layer in view of the potential of the second metal layer as a reference potential, and a negative potential is applied the second metal layer in view of the potential of the first metal layer as a reference potential. As a result, as compared to the case in which the first and second impurity diffusion regions are formed in contact with each other, when a reverse bias is applied, in other words, when a negative potential is applied to the first metal layer in view of the potential of the second metal layer as a reference potential, and a positive potential is applied to the second metal layer in view of the potential of the first metal layer as a reference potential, the density of current passed from the bottom side of the second impurity diffusion region to the second metal layer may be reduced. Therefore, the concentration of current based on the uneven operation of locally great recovery current passed between the second impurity diffusion region and the second metal layer, which is caused when a reverse bias is applied, may be restrained. Accordingly, destruction by heat in the vicinity of the second impurity diffusion region caused by the temperature rise in the vicinity by the recovery current may be restrained.

A semiconductor device according to another aspect of the present invention includes a semiconductor substrate of a first conductivity type, a first impurity diffusion region formed from a first main surface of the semiconductor substrate to a prescribed depth, second impurity diffusion regions provided at prescribed intervals at the first main surface of the semiconductor substrate to surround the first impurity diffusion region in a region outside the first impurity diffusion region, having a depth from the first main surface deeper than the first impurity diffusion region and a concentration higher than that of the first impurity diffusion region, a second metal layer provided in contact with a second main surface the semiconductor substrate, and a resistance region having a resistance value higher than that the first impurity diffusion region serving as a resistance against current passed from the first impurity diffusion region to the second impurity diffusion region and a region between the first impurity diffusion region and the second impurity region.

Thus, since the resistance region is formed in the first impurity diffusion region or between the first and second impurity diffusion regions, when a forward bias is applied, in other words, a positive potential is applied to the first metal layer in view of the potential of the second metal layer as a reference potential, and a negative potential is applied to the second metal layer in view of the potential of the first metal layer as a reference potential, the resistance region serves as the resistance against current passed to the second impurity diffusion region from the first impurity diffusion region, and does not pass current thus, when a forward bias is applied, in other words, a potential is applied to the first metal layer in view of the potential of the second metal layer as a reference potential, and a positive potential is applied to the second metal layer in view of the potential of the first metal layer as a reference potential, the density of current passed from the bottom side of the second impurity diffusion region to the second metal layer may be reduced. Thus, when a reverse bias is applied, the concentration of current based on the uneven operation of recovery current locally greatly generated between the second impurity diffusion region and the second metal layer may be restrained. As a result, destruction by heat in the vicinity of the second impurity diffusion region caused by a temperature rise in the vicinity of the second impurity diffusion region by the recovery current may be restrained.

A semiconductor device according to another aspect of the present invention includes a semiconductor substrate of a first conductivity type, a first impurity diffusion region of a second conductivity type formed from a first main surface of the semiconductor substrate to a prescribed depth, second impurity diffusion regions provided at prescribed intervals in the first main surface of the semiconductor substrate in a region outside the first impurity diffusion region to surround the first impurity diffusion region, and having a depth from the first main surface greater than the first impurity diffusion region and a concentration higher than the first impurity diffusion region, a first metal layer provided in contact with the first impurity diffusion region on the first main surface of the semiconductor substrate, a second metal layer provided in contact with the second main surface of the semiconductor substrate, and a resistance region provided in the first impurity diffusion region or in the region between the first and second impurity diffusion regions, having a resistance value higher than the first impurity diffusion region, and serving as a resistance against current passed from the first impurity diffusion region to the second impurity diffusion regions.

Thus, since the resistance region is formed in the first impurity diffusion region or in the region between the first and second impurity diffusion regions, when a forward bias is applied, in other words, when a positive potential is applied to the first metal layer in view of the potential of the second metal layer as a reference potential, and a negative potential is applied to the second metal layer in view of the potential of the first metal layer as a reference potential, the resistance region serves as a resistance against current passed from the first impurity diffusion region to the second impurity diffusion regions to prevent the passage of current. Thus, when a forward bias is applied, in other words, when a negative potential is applied to the first metal layer in view of the potential of the second metal layer as a reference potential, and a positive potential is applied to the second metal layer in view of the potential of the first metal layer as a reference potential, the density of current passed from the bottom side of the second impurity diffusion region toward the second metal layer may be reduced. Thus, when a reverse bias is applied, the concentration of current based on the uneven operation of locally great recovery current generated between the second impurity diffusion regions and the second metal layer may be restrained. As a result, destruction by heat in the vicinity of the second impurity diffusion regions caused by a temperature rise in the vicinity by the recovery current may be restrained.

In the semiconductor device according to the present invention, the resistance region is preferably formed by filling an insulating film in a trench formed from the first main surface of the semiconductor substrate to a prescribed depth between the first and second impurity diffusion regions.

Thus, the insulating layer filled within the trench serves as a resistance region between the first and second impurity diffusion regions, and destruction by heat in the vicinity of the second impurity diffusion regions caused by a temperature rise in the vicinity by recovery current may be restrained as is the case with the above resistance region.

Also in this case, if the second metal layer is formed about as large as the first impurity diffusion region, the insulating film filled within the trench effectively serves as an insulator, current passed from the first metal layer to the second metal layer may be evenly distributed in the widths-wise direction of the semiconductor substrate as the same voltage applied across the region between the first metal layer and the second metal layer. As a result, the current/voltage characteristics between the first and second metal layers may be improved.

In the semiconductor device according to the present invention, the resistance region may be a fourth impurity diffusion region of the second conductivity type provided between the first and second impurity diffusion regions and having a concentration lower than the first impurity diffusion region.

Thus, since an outer peripheral part of the fourth impurity diffusion region of the second conductivity type, having a relatively low concentration, and formed between the first and second impurity diffusion regions may serve as a resistance region, destruction by heat in the vicinity of the second impurity diffusion region caused by a temperature rise in the vicinity by recovery current may be restrained as is the case with the above resistance region.

In the semiconductor device according to the present invention, the resistance region may include a plurality of annular fifth impurity diffusion regions of the second conductivity type, having a concentration lower than the second impurity diffusion region and formed in the first impurity diffusion region from the first main surface of the semiconductor substrate to a prescribed depth, surrounding about the center of the first impurity diffusion region to this center.

Thus, the plurality of fifth impurity diffusion regions of the second conductivity type formed in the first impurity diffusion region and having a relatively low concentration may serve as a resistance region, and destruction by heat in the vicinity of the second impurity diffusion region caused by a temperature rise in the vicinity by recovery current may be restrained as is the case with the effect of the above resistance region.

Also in this case, if the first metal layer is formed about as large as the first impurity diffusion region, since the fifth impurity diffusion regions effectively serve as a resistance, the concentration of current in the vicinity of the region immediately below the second impurity diffusion regions is not caused in a forwardly biased state. As a result, when a reverse bias is applied, the concentration of current in the vicinity of the region immediately below the second impurity diffusion regions may be restrained. Therefore, current passed from the first metal layer to the second metal layer may be distributed evenly in the width-wise direction of the semiconductor substrate as the same voltage is applied across the region between the first and second metal layers. As a result, the current/voltage characteristics between the first and second metal layers may be improved.

In the semiconductor device according to the present invention, the resistance region may be a sixth impurity diffusion region of the second conductivity type, formed between the first and second impurity diffusion regions at a prescribed distance from the innermost circumference of the second impurity diffusion region, and having an impurity implantation depth shallower than the first impurity diffusion region and a concentration lower than the first impurity diffusion region.

Thus, the semiconductor substrate of the first conductivity type formed in the first impurity diffusion region of the second type conductivity and between the sixth and second impurity diffusion regions may serve as a resistance region, and current flowed from the first impurity diffusion region and sixth impurity diffusion region to the second impurity diffusion regions may be blocked by the semiconductor substrate of the first conductivity type. As a result, current is not allowed to flow to the second impurity diffusion region.

Accordingly, as is the case with the effect of the resistance region as described above, destruction by heat in the vicinity of the second impurity diffusion region caused by a temperature rise in the vicinity by recovery current may be restrained.

Also, in this case, if the first metal layer is formed about as large as the first impurity diffusion region, the semiconductor substrate of the first conductivity type is present in the first impurity diffusion region of the second conductivity type and in the region between the sixth and second impurity diffusion regions, and therefore when a forward bias is applied, in other words, when a negative potential is applied to the first metal layer in view of the potential of the second metal layer as a reference potential, current passed from the first and sixth impurity diffusion regions to the second impurity diffusion regions may be blocked by the semiconductor substrate of the first conductivity type, such that current is not allowed to flow to the second impurity diffusion region. As a result, the concentration of locally great recovery current which is generated toward the bottom side of the second impurity diffusion regions may be restrained. Therefore, current passed from the first metal layer to the second metal layer may be evenly distributed as the same voltage is applied across the region between the first and second metal layers. Consequently, the current/voltage characteristics in the region between the first and second metal layers may be improved.

A semiconductor device according to yet another aspect of the present invention includes a semiconductor substrate of a first conductivity type, a first impurity diffusion region of a second conductivity type, formed from a first main surface of the semiconductor substrate to a prescribed depth, annular second impurity diffusion regions of the second conductivity type formed in the first main surface of the semiconductor substrate in a region outside the first impurity diffusion region at prescribed intervals, surrounding the first impurity diffusion region and having a depth from the first main surface greater than the first impurity diffusion region and a concentration higher than the first impurity diffusion region, such that an impurity concentration in the vicinity of the center in the width-wise direction is lower than in the outermost and innermost circumferences, a first metal layer formed in the first main surface of the semiconductor substrate to such a level to be about in contact with the second impurity diffusion region, and a second metal layer provided in contact with a second main surface of the semiconductor substrate.

Thus, the second impurity diffusion region has a part, the concentration of which is smaller than the other part of the second impurity diffusion region, in the vicinity of the center of the width-wise direction of the annulus. Thus, in the second impurity diffusion region, the hole density is smaller than the case in which the second impurity diffusion region has a constant concentration distribution in the width-wise direction. As a result, when a forward bias is applied, in other words, when a positive potential is applied to the first metal layer in view of the potential of the second metal layer as a reference potential, the density of current passed from the second impurity diffusion region to the second metal layer is relatively small. As a result, when a reverse bias is applied, in other words, a positive potential is applied to the first metal layer in view of the potential of the second metal layer as a reference potential, and a negative potential is applied to the second metal layer in view of the potential of the first metal layer as a reference potential, the concentration of locally great recovery current may be restrained. Consequently, destruction by heat in the vicinity of the second impurity diffusion region caused by a temperature rise in the vicinity by recovery current may be restrained.

Furthermore, since the hole density is lowered to restrain the concentration of recovery current by lowering the density in the center of part in the width-direction, without changing the width and diffusion depth of the second impurity diffusion region, the effect of preventing electric field concentration will not be lowered.

Also, in this case, if the first metal layer is formed about as large as the first impurity diffusion region, a part with a lower concentration in the central part of the second impurity diffusion region may effectively serve as a resistance, the concentration of the locally great recovery current may be restrained. As a result, current passed from the first metal layer to the second metal layer as the same voltage is applied across the region between the first and second metal layers may be distributed evenly in the width-wise direction of the semiconductor substrate. Consequently, the current/voltage characteristics between the first and second metal layers may be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
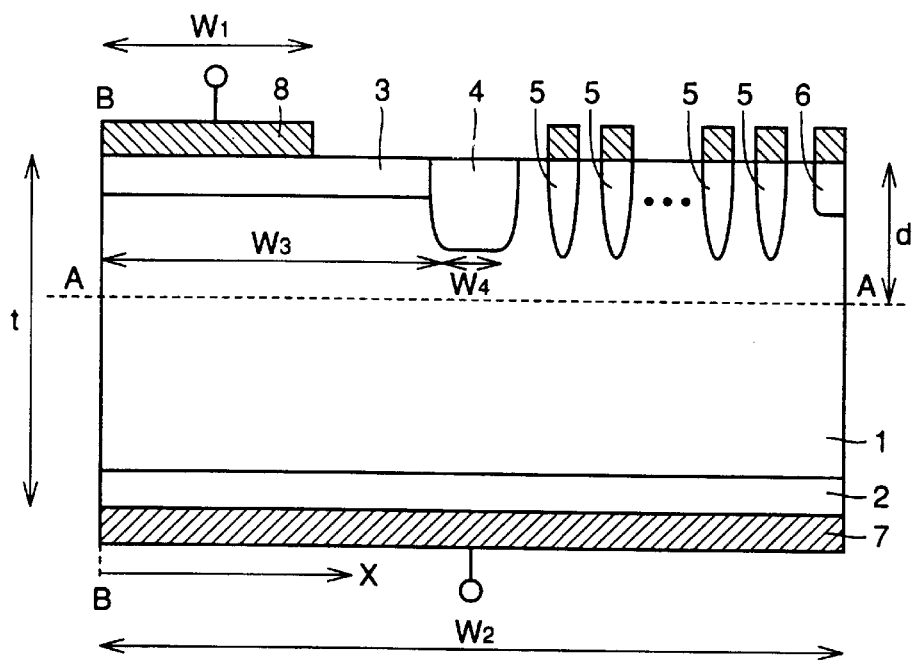
FIG. 1 is a cross sectional view showing the right half of a symmetrical cross section taken perpendicularly to the electrode surface of an FWD according to a first embodiment of the present invention.
Figure 16:
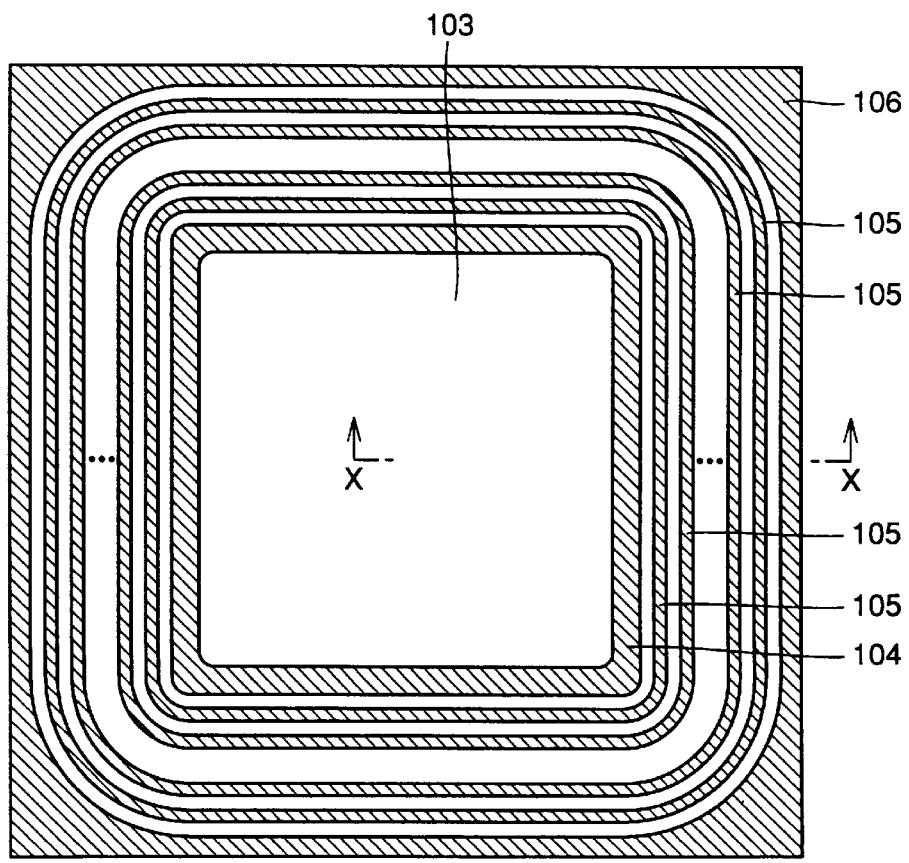
FIG. 16 is a plan view seen from the side of an anode electrode in a conventional FWD.
Figure 17:
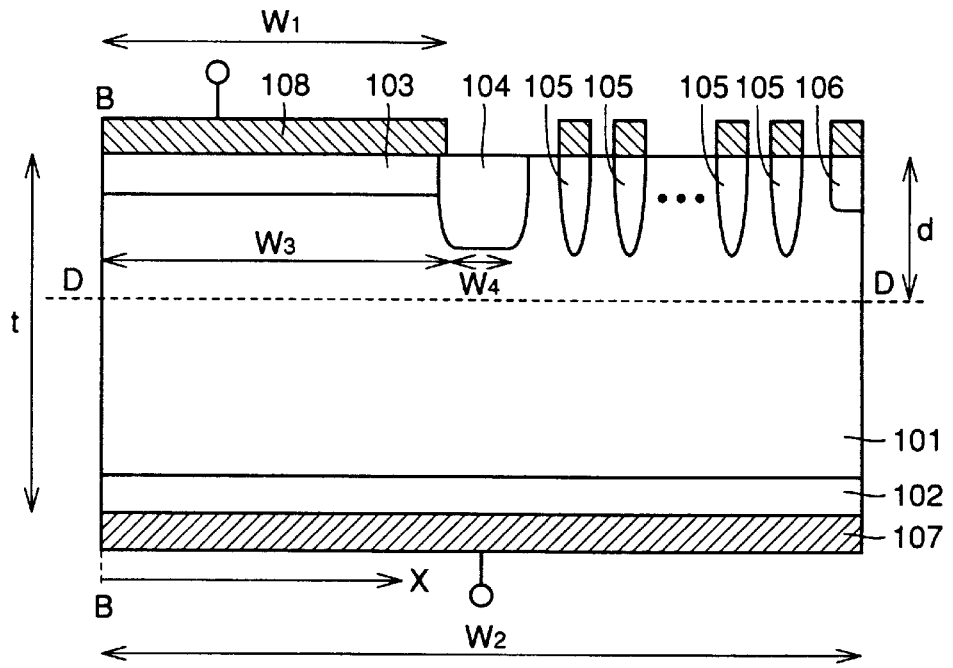
FIG. 17 is a cross sectional view showing the right half of a symmetrical cross section taken perpendicularly to the semiconductor substrate of a conventional FWD.
Figure 18:
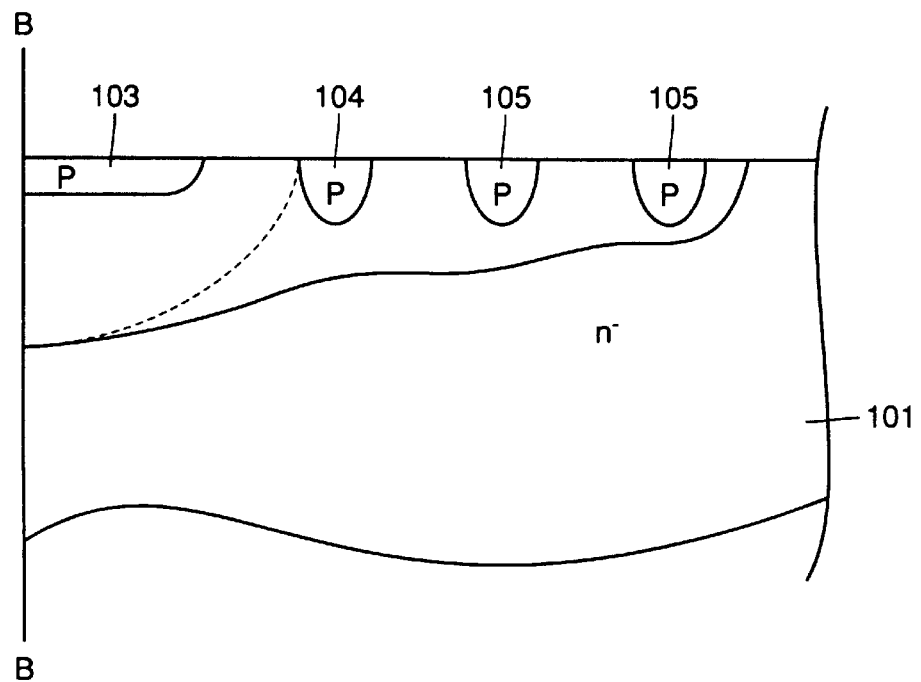
FIG. 18 is an illustration showing how an equipotential surface extends outwardly under a field limiting layer.

Embodiments of the present invention will be now described in conjunction with accompanying drawings First Embodiment An FWD according to a first embodiment of the present invention will be now described in conjunction with FIGS. 1 to 9. FIG. 1 is a cross sectional view of an FWD taken along line x—x in a plan view of the FWD as shown in FIG. 16. The structure of the FWD according to the first embodiment will be now described.

A plan view of the FWD according to the present embodiment seen from the surface of the semiconductor substrate is similar to FIG. 16. In an n-type semiconductor substrate 1 having a width $w_2$ of 5600 μm and a thickness of t of 500 μm in the cross section shown in FIG. 1, there are formed a cathode layer 2, an n-type impurity diffusion region having a concentration higher than semiconductor substrate 1, formed from a main surface on the bottom of semiconductor substrate 1 to a prescribed depth, and an anode layer 3 having a width $w_3$ of 3450 μm, a p-type impurity diffusion region having a surface concentration of $5\times10^{16}/cm^3$, formed in a region having a diffusion depth of 6 μm from the main surface on the top side to an axis about in the center of the plan view in FIG. 16 on the main surface on the top side of semiconductor substrate 1, in other words, from line B—B in FIG. 1 to a position at a prescribed distance.

There is provided a field limiting innermost circumferential layer 4, an annular p-type impurity diffusion region, formed in the main surface on the top side of semiconductor substrate 1 to two-dimensionally surround anode layer 3, and having a diffusion depth from the main surface on the top side of semiconductor substrate 1 as large as 10 μm, a width $w_4$ of 50 μm when viewed in a cross section, and a diffusion concentration of $1\times10^{19}/cm^3$, higher than that of anode layer 3, such that the diffusion depth is larger than anode layer 3. There are a plurality of field limiting layers 5, a group of annular p-type impurity diffusion regions, provided at prescribed intervals outside and around field limiting innermost circumferential layer 4, and having the same concentration as field limiting innermost circumferentail layer 4, a diffusion depth of 10 μm and a diffusion concentration of $1\times10^{19}/cm^3$.

A stopper channels layer 6, an n-type impurity diffusion region having a concentration higher than that of semiconductor substrate 1 is provided at the outermost circumference of semiconductor substrate 1. There are also provided a cathode electrode metal layer 7 composed of gold, provided adjacent to cathode layer 2, and an anode electrode metal layer 8 composed of aluminum, provided adjacent to anode layer 3. In this embodiment, the width $w_1$ of anode electrode metal layer 8 is 3000, 2500, and 2000 μm, each shorter than the width of anode layer 3 by a prescribed length unlike the conventional cases.

Figure 2:
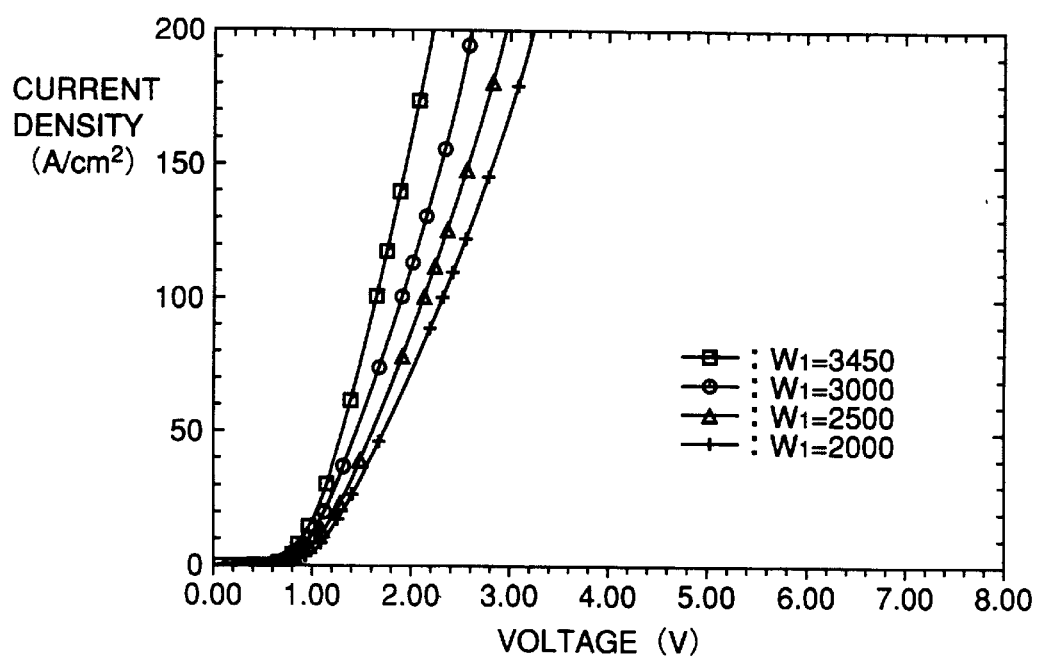
FIG. 2 is a graph showing the current/voltage characteristics in the forward direction where the radial length $w_1$ of a anode electrode metal layer in the FWD according to the first embodiment is 3450, 3000, 2500 and 2000 $\mu$m.
Figure 3:
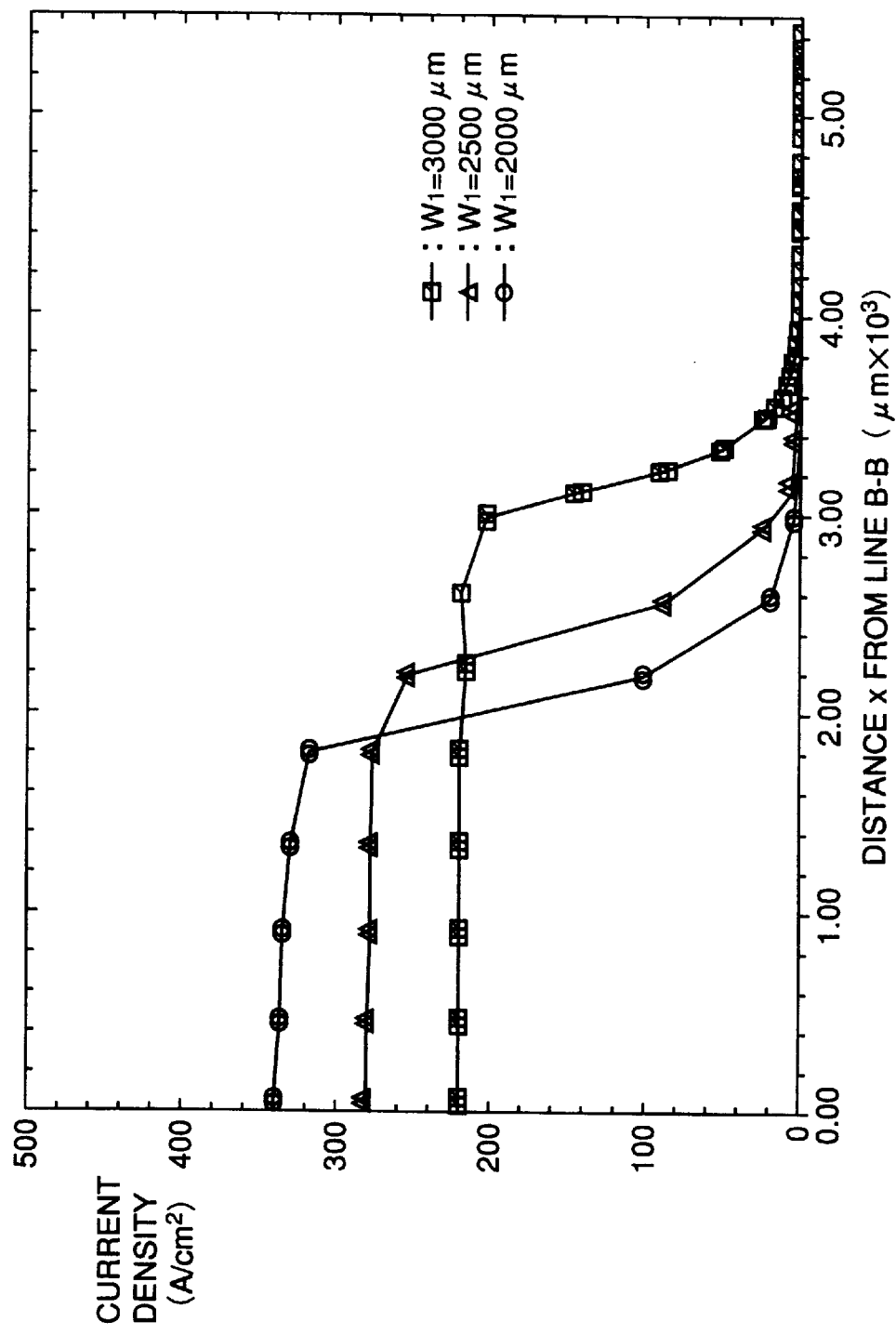
FIG. 3 is a graph showing the relation between the distance from line B—B in the FWD and the current density in a cross section taken along line A—A, where the radial length wi of the anode electrode metal layer in the FWD according to the first embodiment is 3000, 2500, and 2000 $\mu$m.
Figure 4:
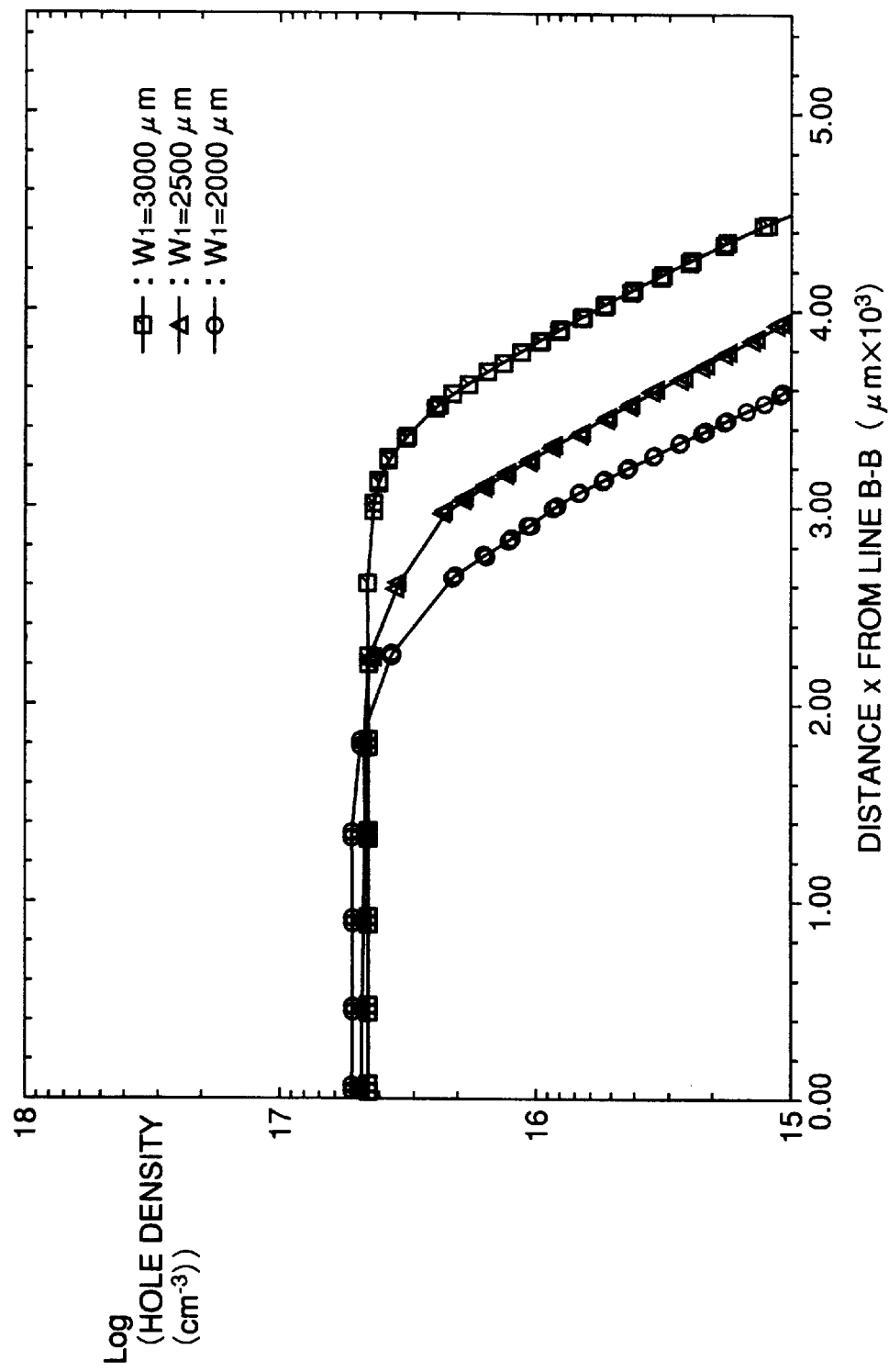
FIG. 4 is a graph showing the relation between the distance from line B—B to a free wheel diode and the hole density in the cross section taken along line A—A, where the radial length $w_1$ of the anode electrode metal layer in the FWD according to the first embodiment is 3000, 2500, and 2000 $\mu$m.
Figure 19:
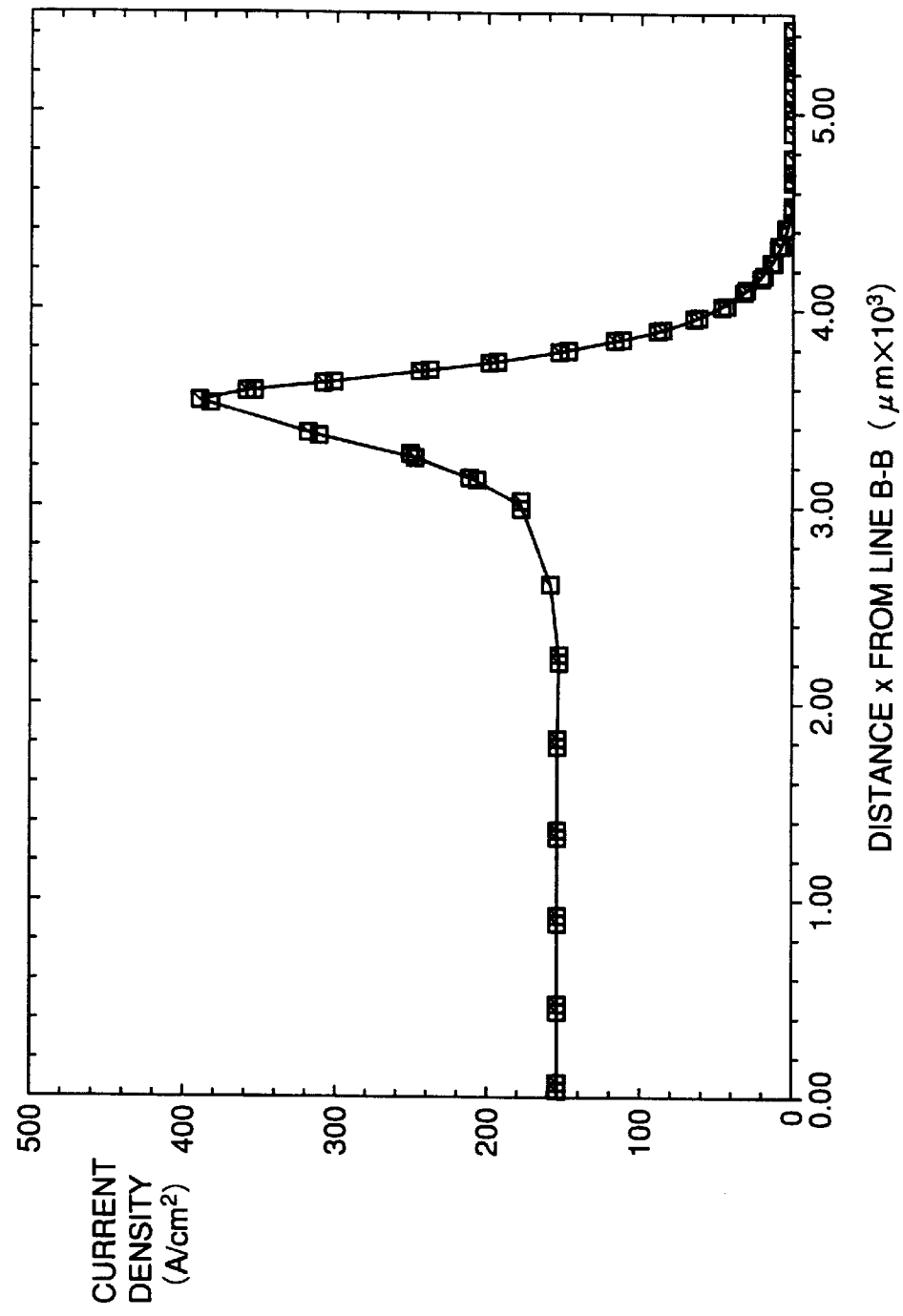
FIG. 19 is a graph showing the relation between the current density distribution of an anode electrode in a conventional FWD where $w_1$ is 3450 μm as in FIG. 17 and the distance from line B—B in FIG. 1 to the outermost circumference of metal layer 8 for anode electrode.
Figure 20:
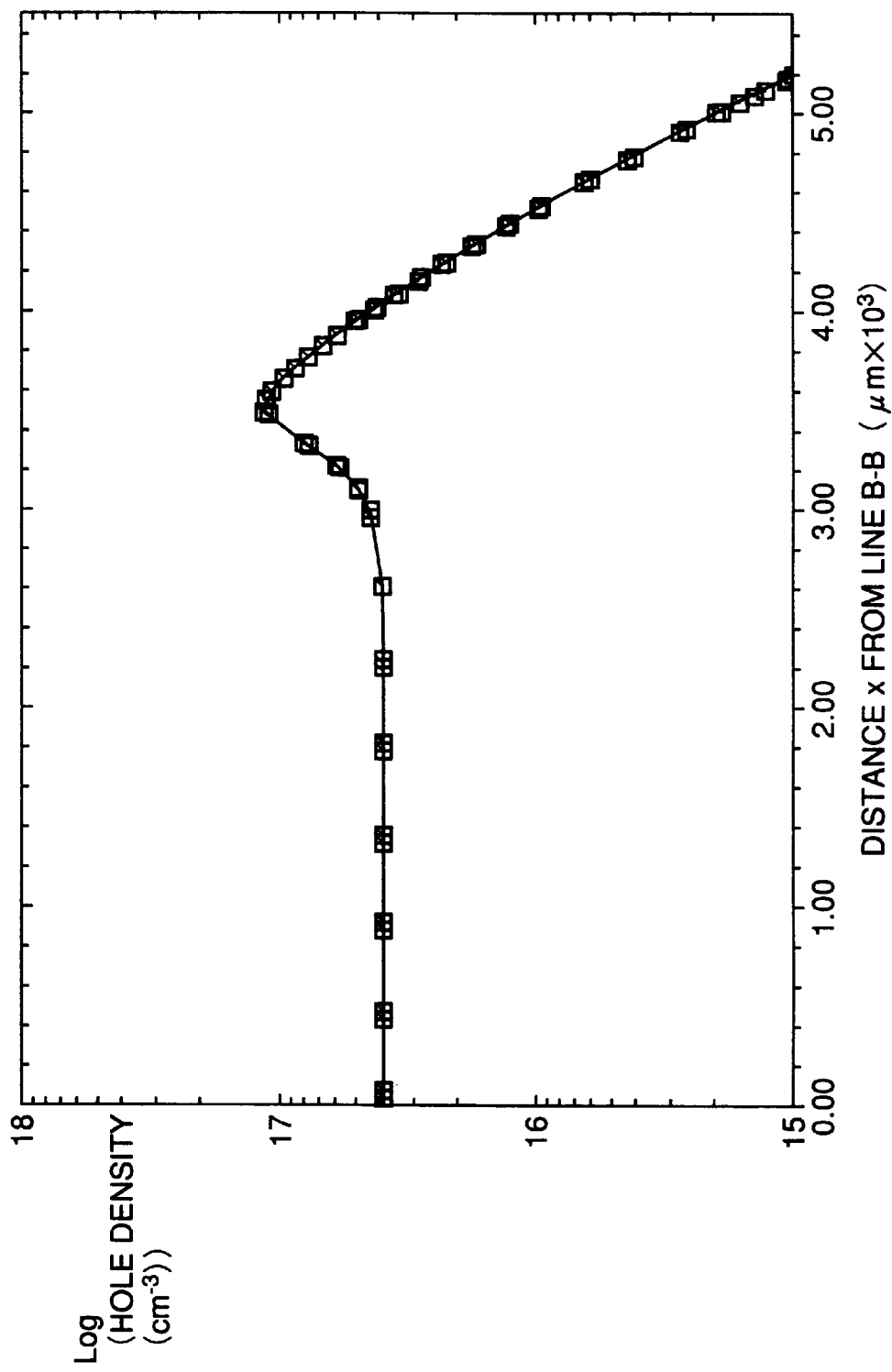
FIG. 20 is a graph showing the relation between the hole density distribution of the anode electrode in the conventional FWD at $w_1$=3450 μm in FIG. 17 and the distance between line B—B in FIG. 1 and the outermost circumference of metal layer 8 for anode electrode.
Figure 21:
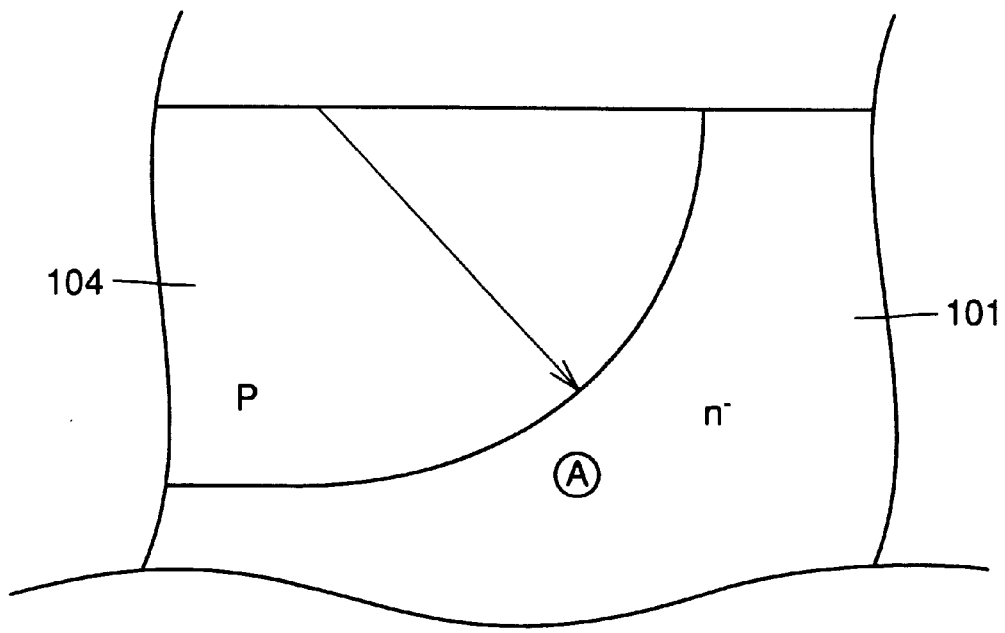
FIG. 21 is an illustration showing a field limiting innermost circumferential layer when the radius of curvature is large.
Figure 22:
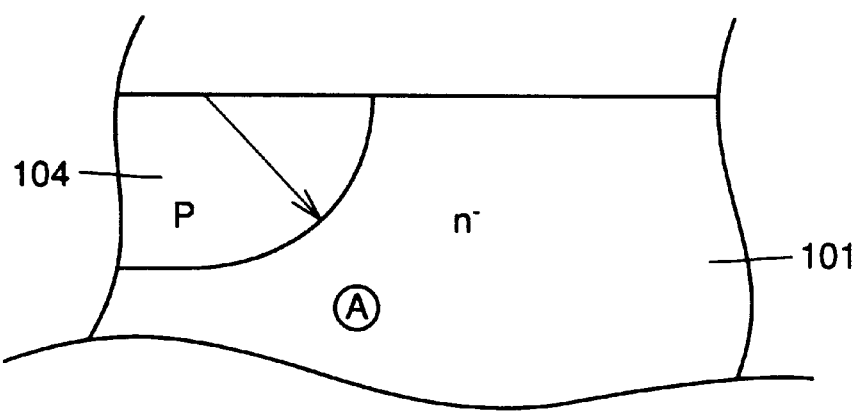
FIG. 22 is an illustration showing the field limiting innermost circumferential layer when the radius of curvature is small.
Figure 23:
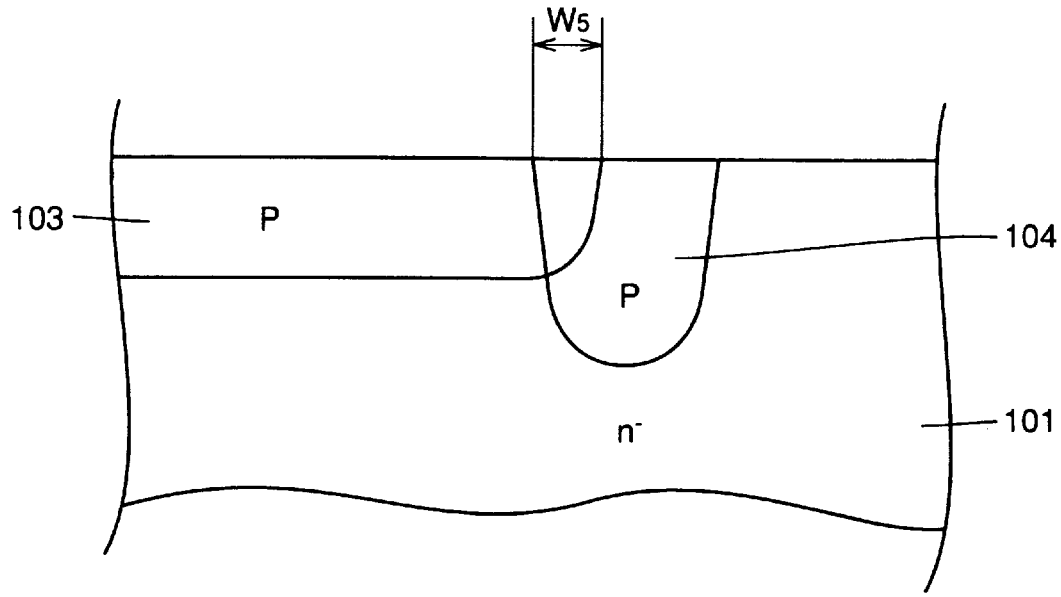
FIG. 23 is an illustration showing an anode layer and a field limiting innermost circumferential layer with a small overlapping area.
Figure 24:
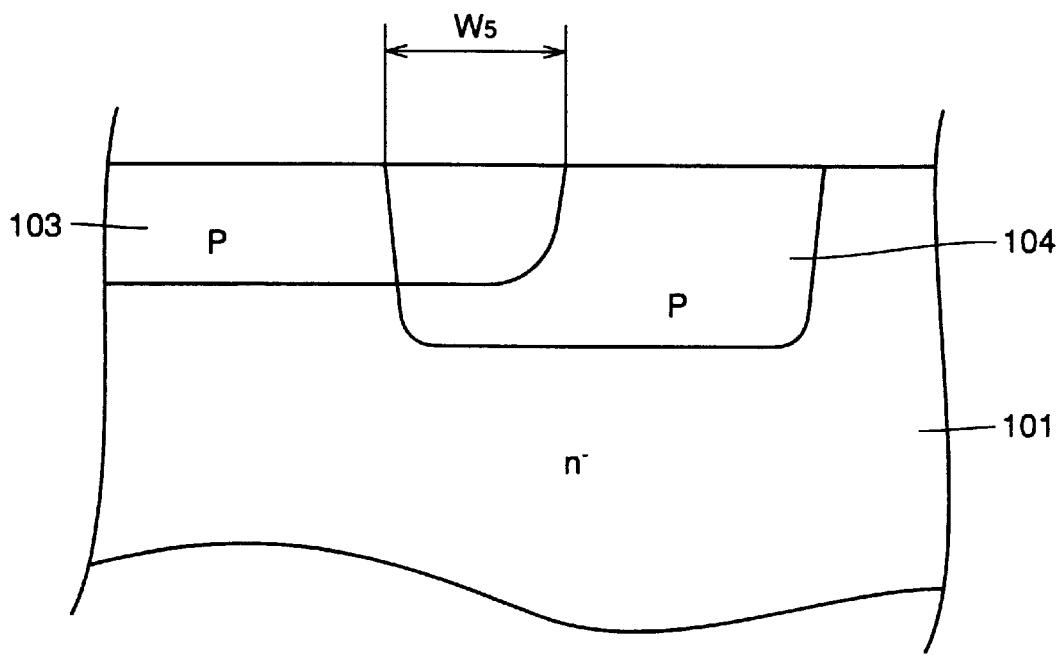
FIG. 24 is an illustration showing an anode layer and a field limiting innermost circumferential layer with a large overlapping area.
Figure 25:
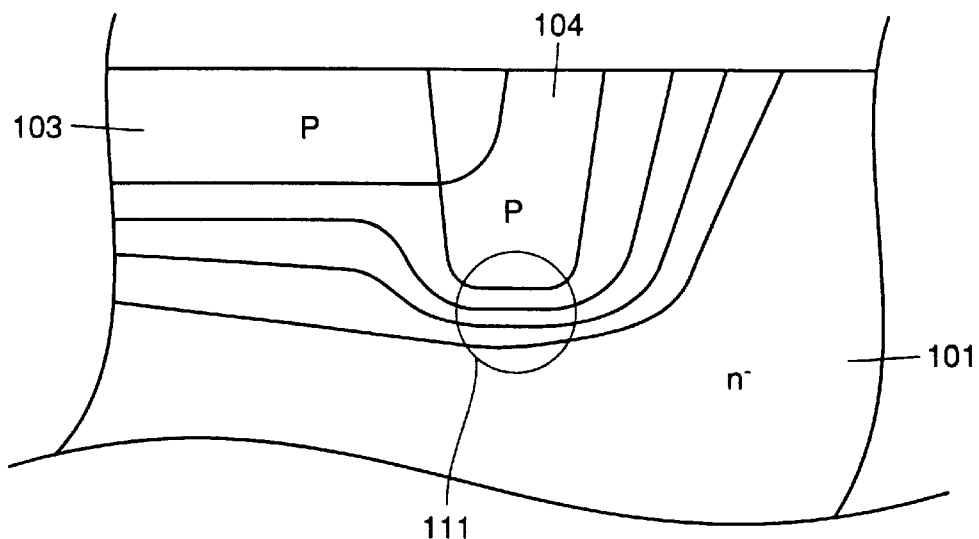
FIG. 25 is an illustration showing an equipotential surface when the width of the bottom of the field limiting innermost circumferential layer is small.
Figure 26:
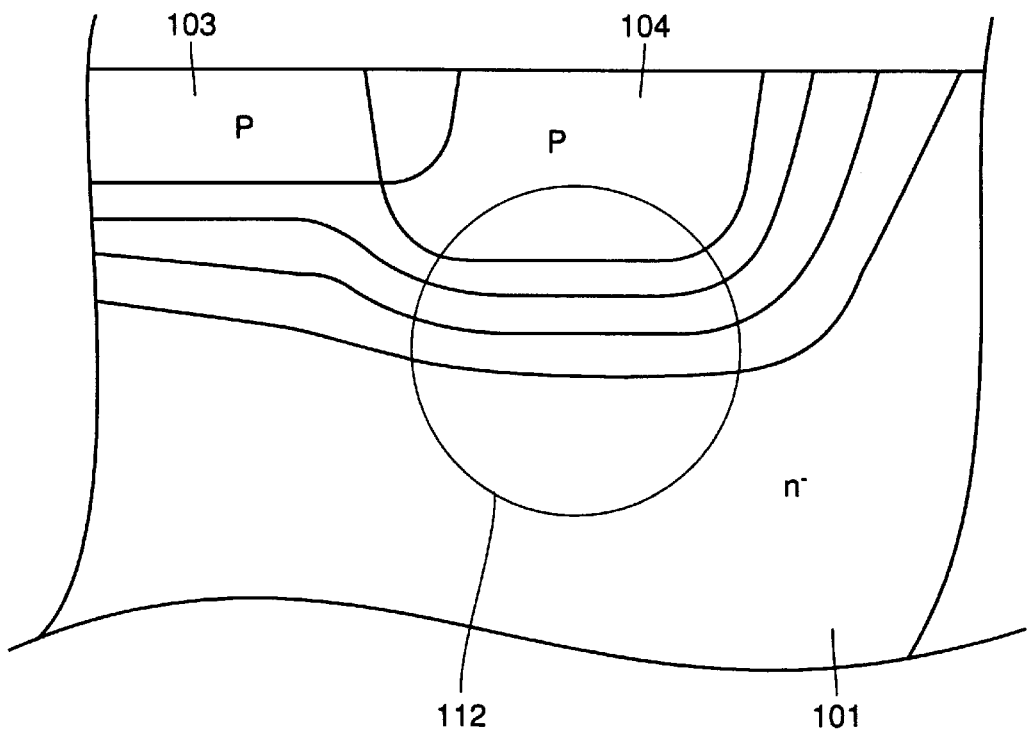
FIG. 26 is an illustration showing an equipotential surface when the width of the bottom of the field limiting innermost circumferential layer is large.
Figure 27:
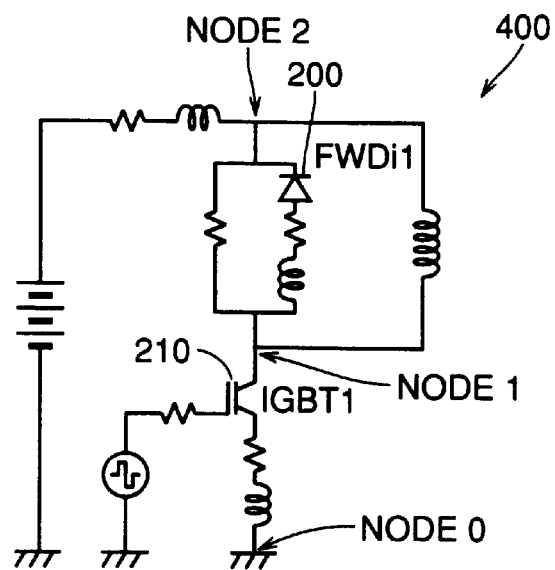
FIG. 27 is a schematic diagram showing a half bridge circuit having an FWD build therein.
Figure 28:
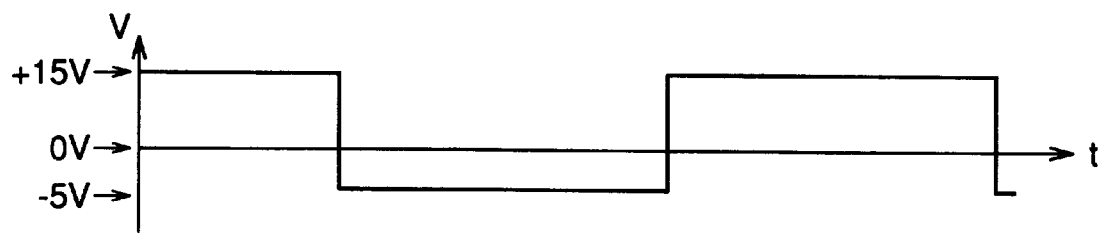
FIG. 28 is a waveform chart showing the waveform of the power supply of an IGBT.
Figure 29:
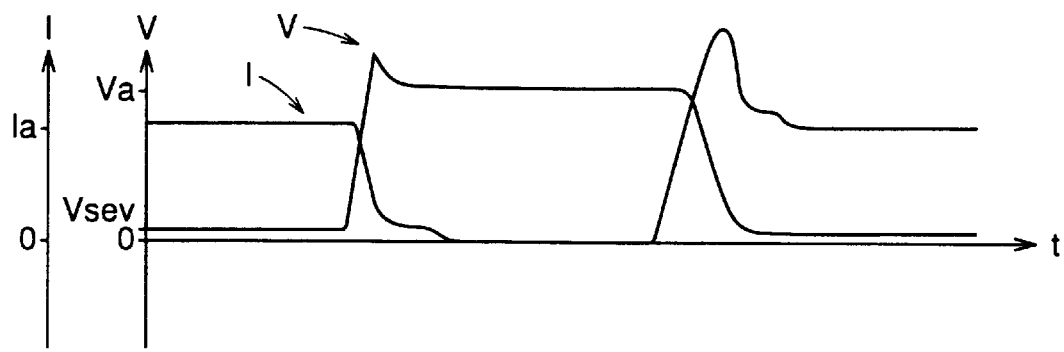
FIG. 29 is a waveform chart showing a node 0–node 1 current/voltage loss, when the IGBT is switched from an off state to an on state in the half bridge circuit having the FWD shown in FIG. 24 built therein.
Figure 30:
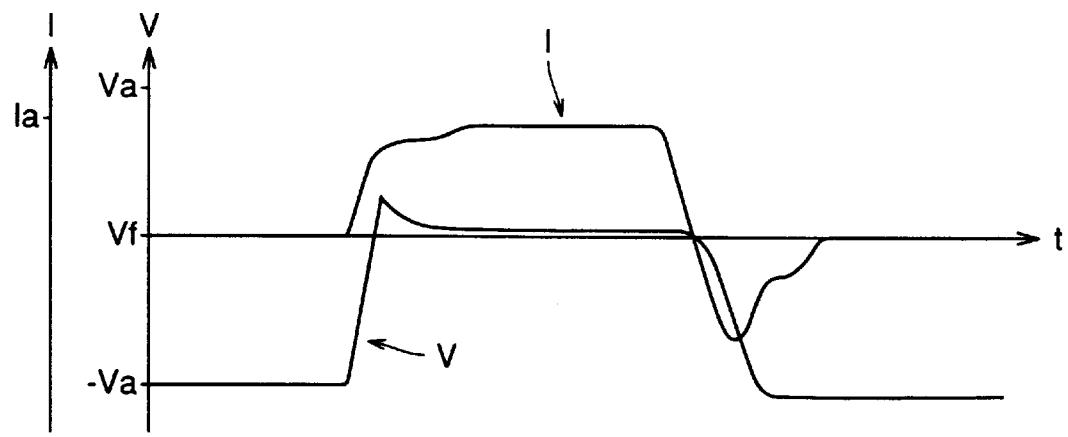
FIG. 30 is a waveform chart showing a node 1–node 2 current/voltage loss, when the IGBT is switched from an off state to an on state in the half bridge circuit having the FWD shown in FIG. 24 build therein.

The relation between the current density and voltage corresponding to the cases where $w_1$ is 3000, 2500 and 2000 μm is given in FIG. 2. As shown in FIG. 2, when Wi is smaller, the current density as the same voltage is applied decreases, which degrades the characteristic of a diode. Data given in FIG. 3 is represented in a graph showing the relation between the current density distribution where $w_1$ is 3000, 2500, and 2000 μm and the distance from line B—B in FIG. 1 to the outermost circumference of anode electrode metal layer 8. Data given in FIG. 4 is represented in a graph showing the relation between the hole density distribution where $w_1$ is 3000, 2500, and 2000 μm and the distance of anode electrode metal layer 8 from line B—B in FIG. 1 to the outermost circumference. As can be seen from the graphs, when $w_1$ is 3000, 2500 and 2000 μm, uneven distribution of the current densities as shown in FIGS. 19 and 20 according to the conventional cases is eliminated.

Thus, on the top side of semiconductor substrate 1, there is secured a prescribed distance between the outermost circumferential surface of anode electrode metal layer 8 and the innermost circumferential surface of field limiting innermost circumferential layer 4. Thus, between the outermost circumference surface of anode electrode metal layer 8 and the innermost circumferential surface of field limiting innermost circumferential layer 4 in the vicinity of the main surface on the top side of semiconductor substrate 1, an outermost circumferential part of anode layer 3 formed from the main surface on the top side of semiconductor substrate 1 to a depth of 6 μm viewed two-dimensionally serves as a resistance to prevent the passage of current generated under anode electrode metal layer 8 toward field limiting innermost circumferential layer 4, when a forward bias is applied, in other words, when a positive potential is applied to anode electrode metal layer 8 and a negative potential is applied to cathode electrode metal layer 7, as can be seen from resistance Ro across path II shown in FIG. 5. The even specific resistance $\rho_p$ of the p-type semiconductor substrate, where the impurity concentration is $N_A$ (cm$^{-3}$), is given as follows:

$$\rho_p = \frac{5.86 \times 10^{12} + N_A^{0.76}}{7.86 \times 10^{-18} \times N_A^{-1.76} + 4.64 \times 10^{-4}}$$

Figure 5:
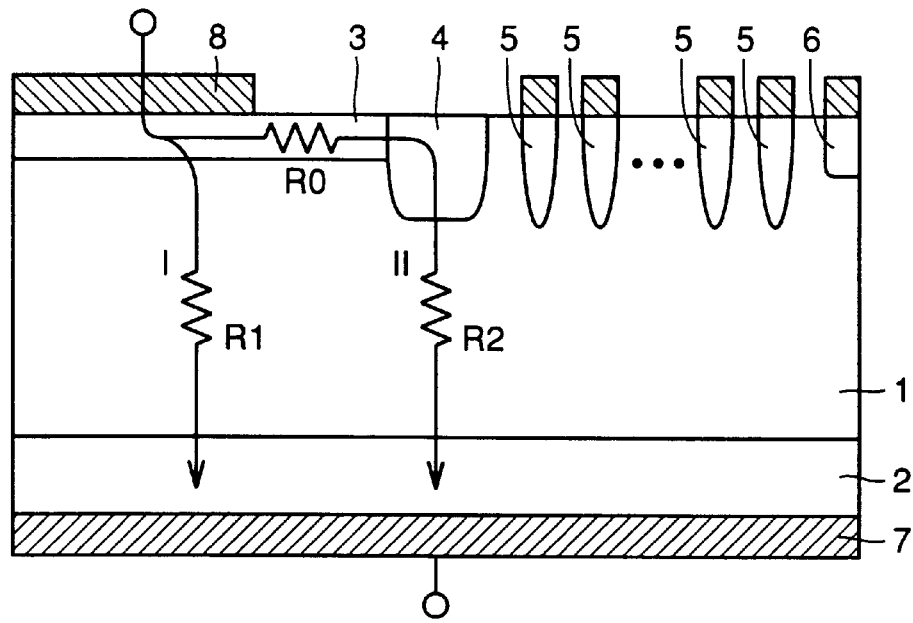
FIG. 5 is a schematic illustration showing a current path and a part serving as a resistance in the path when a forward bias is applied in the FWD according to the first embodiment.

$N_A$ is the impurity concentration of anode layer 3. According to the above expression, if $N_A$ equals $1 \times 10^{16}$/cm$^3$, specific resistance ρp is about 0.2105 Ωcm. If the distance from the outermost circumference of anode layer 3 to field limiting innermost circumferential layer 4 is 500 μm, the resistance value $R_0$ across path II in FIG. 5 is about 0.1053Ω.

Meanwhile, the resistance value $R_1$ of the part of n-type semiconductor substrate 1 in path I is given by the following expression, where the voltage at 100 A/cm$_2$ is 1.5 V, and the contact potential at the pn junction surface is 0.7 V, $$R_1 = \frac{1.5V - 0.7V}{100A} = 0.8\Omega$$

The resistance value $R_1$ of path I is 0.8Ω, while the resistance value $R_0+R_2$ of path II is 0.8Ω+0.1Ω=Ω, in other words, the value is larger in path II than in path I, current allowed through path II is extremely smaller than current allowed through path I.

As a result, the density of current passed from the bottom side of field limiting innermost circumferential layer 4 toward cathode layer 2 may be reduced, in other words, the concentration of current may be restrained as compared to the case where anode electrode metal layer 8 is formed large enough to be in direct contact with field limiting innermost circumferential layer 4. Thus, when a reverse bias is applied, in other words, a negative potential is applied to anode electrode metal layer 8, in view of the potential of cathode electrode metal layer 7 as a reference potential, and a positive potential is applied to cathode electrode metal layer 7, in view of the potential of anode electrode metal layer 8 as a reference potential, the concentration of locally great recovery current flowing toward field limiting innermost circumferential layer 4, i.e., the concentration of the current caused by the flow back of holes accumulated under field limiting innermost circumferential layer 4. Consequently, destruction by heat in the vicinity of field limiting innermost circumferential layer 4 caused by a temperature rise under field limiting innermost circumferential layer 4 by recovery current may be restrained.

Second Embodiment

Figure 6:
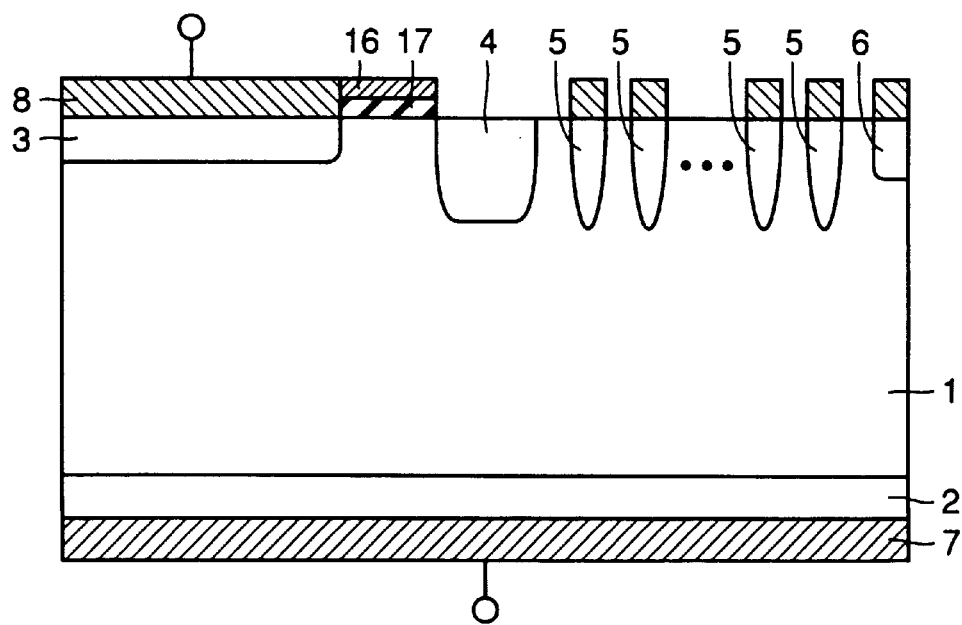
FIG. 6 is a cross sectional view showing the right half of a symmetrical cross section taken perpendicularly to the electrode surface of an FWD according to a second embodiment of the present invention.
Figure 7:
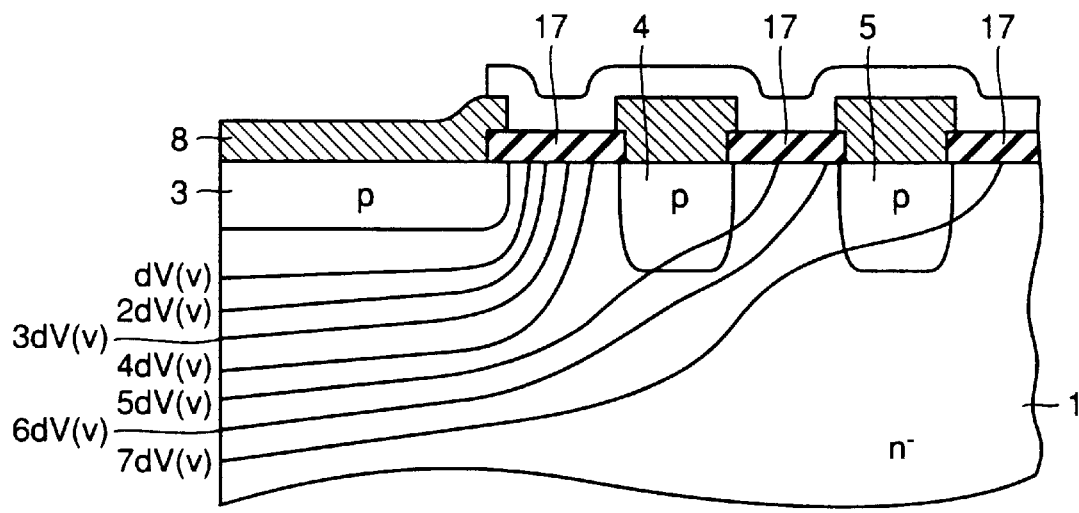
FIG. 7 is an illustration showing an equipotential surface without a field plate in the vicinity of the outer periphery of an anode in the FWD according to the second embodiment.

An FWD according to a second embodiment of the present invention will be now described in conjunction with in FIG. 6. A top view of the FWD according to this embodiment seen from the surface of the semiconductor substrate is identical to the top view shown in FIG. 16. A cross section taken along line x—x in the plan view of the FWD as in FIG. 16 is given in FIG. 6. The FWD according to this embodiment includes a semiconductor substrate 1, a cathode layer 2, a field limiting innermost circumferential layer 4, a field limiting layer 5, a stopper channel layer 6, a cathode electrode metal layer 7, and a anode electrode metal layer 8 as is the case with the FWD according to the first embodiment. In the FWD according to this embodiment, the length of anode layer 3 in the radial direction is short and the portion between anode layer 3 and field limiting innermost circumferential layer 4 is electrically disconnected by the function of n-type semiconductor substrate 1, while a field plate 16 composed of aluminum is provided on a main surface of semiconductor substrate 1 from the outermost circumference of anode electrode metal layer 8 to the inner surface of field limiting innermost circumferential layer 4 through an insulating layer, unlike the FWD according to the first embodiment.

Thus, the part of semiconductor substrate 1 of n-type remains without being implanted with an impurity between p-type anode layer 3 and field limiting innermost circumferential layer 4, and semiconductor substrate 1 cuts off current passed from anode layer 3 to field limiting innermost circumferential layer 4 when a forward bias is applied. Thus, the hole density distribution may be prevented from being locally great under field limiting innermost circumferential layer 4. As a result, the density of current passed from the bottom side of field limiting innermost circumferential layer 4 to cathode layer 2 may be reduced. Therefore, the concentration of locally great recovery current passed between cathode layer 2 and field limiting innermost circumferential layer 4 which is caused when a reverse bias is applied may be restrained. As a result, destruction by heat in the vicinity of field limiting innermost circumferential layer 4 caused by a temperature rise in the vicinity by recovery current may be restrained.

Figure 8:
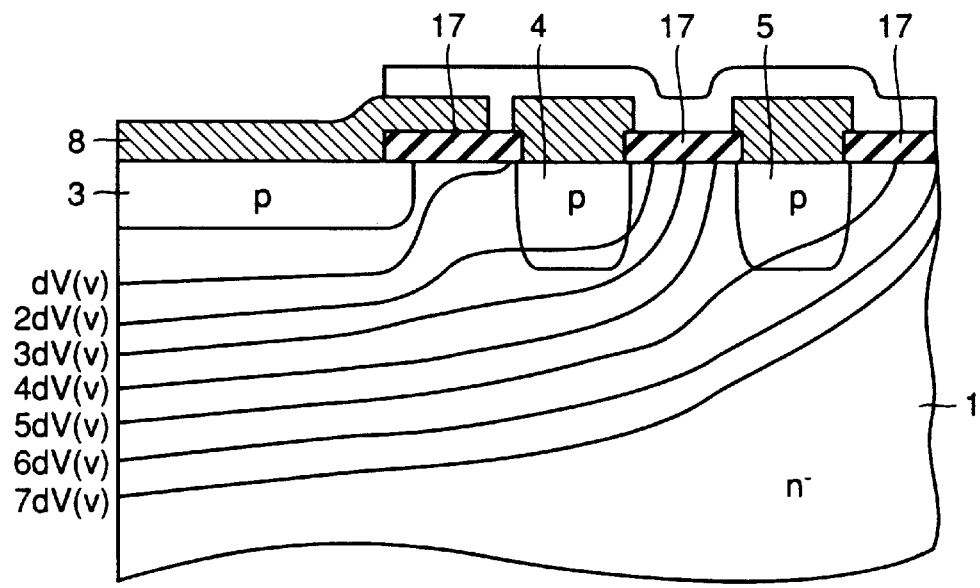
FIG. 8 is an illustration showing an equipotential surface with a field plate in the vicinity of the out periphery of the anode in the FWD according to the second embodiment.

In the absence of field plate 16, intervals between equipotential surfaces are narrowed between anode layer 3 and field limiting innermost circumferential layer 4, when a reverse bias is applied, which increases charge and the electric field, while in the presence of field plate 16 as shown in FIG. 8, in the potential applied to anode electrode metal layer 8, intervals between equipotential surfaces between anode layer 3 and field limiting innermost circumferential layer 4 is large, when a reverse bias is applied, the higher part of the potential is sent outside, which relaxes the concentration of electric field. Thus, the concentration of electric field generated between anode layer 3 and field limiting innermost circumferential layer 4 may be restrained.

Third Embodiment

Figure 9:
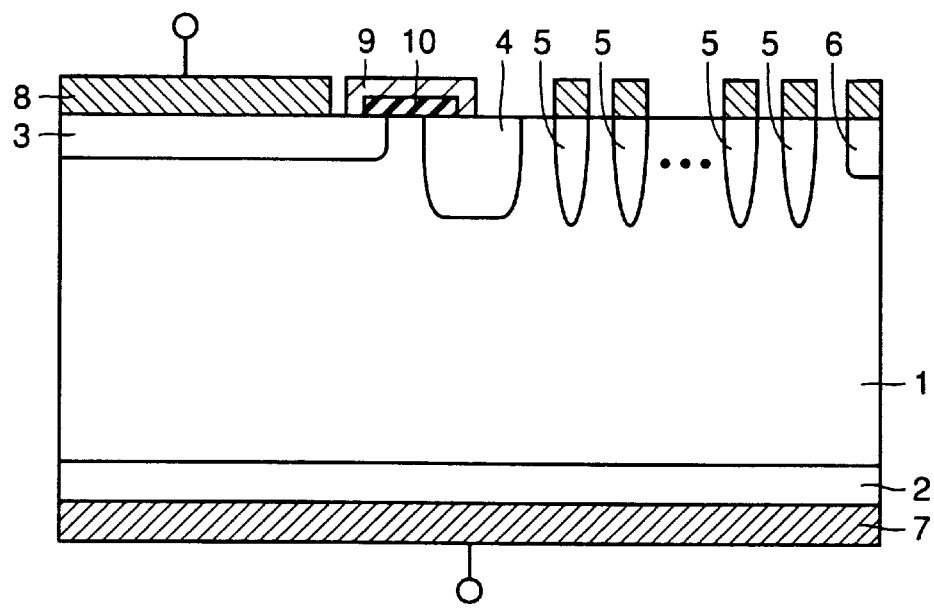
FIGS. 9 to 15 are cross sections showing the right halves of symmetrical cross sections taken perpendicularly to the electrode surfaces of FWDs according to third to ninth embodiments of the present invention.

An FWD according to a third embodiment of the present invention will be now described in conjunction with FIG. 9. A top view of FWD according to this embodiment seen from the surface of the semiconductor substrate is almost the same as that in FIG. 16. A cross section of FWD taken along line x—x in FIG. 16 is as shown in FIG. 9. The FWD according to this embodiment includes a semiconductor substrate 1, a cathode layer 2, a field limiting innermost circumferential layer 4, a field limiting layer 5, a stopper channel layer 6, a cathode electrode metal layer 7, and an anode electrode metal layer 8 as is the case with the FWD according to the first embodiment. In the FWD according to this embodiment, the length of anode layer 3 in the radial direction is short, the outermost circumferential part of anode layer 3 and field limiting innermost circumferential layer 4 are not in direct contact, the conduction therebetween is substantially cut off by n-type semiconductor substrate 1, an insulating film 10 is provided on the surface of semiconductor substrate 1 between the outermost circumferential part of anode layer 3 and field limiting innermost circumferential layer 4, an interconnection 9 composed of polysilicon is provided to cover insulating film 10, and the portion between the outermost circumferential part of anode layer 3 and field limiting innermost circumferential layer 4 conducts, unlike the FWD according to the first embodiment.

Thus, p-type anode layer 3 and field limiting innermost circumferential layer 4 are provided at an interval defined by n-type semiconductor substrate 1. Furthermore, since interconnection 9 (a conductive layer) composed of polysilicon to connect anode layer 3 and field limiting innermost circumferential layer 4 is provided on the main surface of semiconductor substrate 1 on the top side through insulating film 10, an equipotential surfaces having relatively large intervals are formed parallel to the surface of semiconductor substrate 1 and to conductive layer 9 such that electric fields are concentrated between anode layer 3 and field limiting innermost circumferential layer 4.

Current flowed from anode layer 3 to field limiting innermost circumferential layer 4 is reduced by conductive layer 9 serving as a resistance. Therefore, when a reverse bias is applied, the concentration of recovery current passed between cathode layer 2 and field limiting innermost circumferential layer 4 is restrained. As a result, destruction by heat in the vicinity of field limiting innermost circumferential layer 4 caused by a temperature rise in the vicinity by recovery current may be restrained.

Fourth Embodiment

Figure 10:
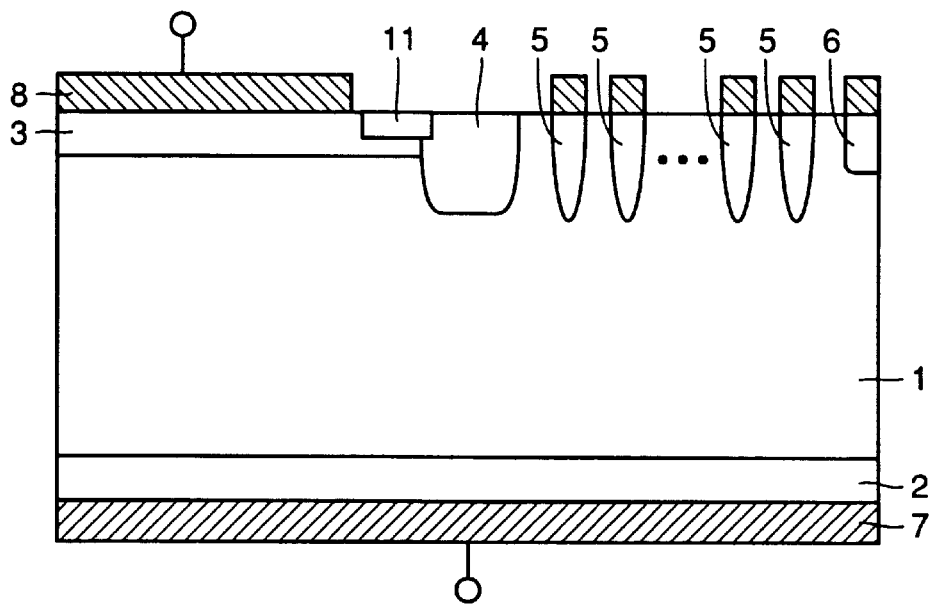

An FWD according to a fourth embodiment of the present invention will be now described in conjunction with FIG. 10. A top view of the FWD according to this embodiment seen from the surface of the semiconductor substrate is substantially the same as the top view in FIG. 16. A cross section taken along line x—x in the top view of the FWD as shown in FIG. 16 is given in FIG. 10. The FWD according to this embodiment includes a semiconductor substrate 1, a cathode layer 2, a field limiting innermost circumferential layer 4, a field limiting layer 5, a stopper channel layer 6, a cathode electrode metal layer 7, and an anode electrode metal layer 8 as is the case with the FWD according to the first embodiment. The FWD according to this embodiment includes an n-type impurity diffusion region 11 having a shallower implantation depth than that of anode layer 3 from the outermost circumference of anode layer 3 to the inner surface of field limiting innermost circumferential layer 4, unlike the FWD according to the first embodiment.

Thus, the p-type part of anode layer 3 having a low concentration immediately under n-type impurity diffusion region 11 serves as a resistance layer between anode layer 3 and field limiting innermost circumferential layer 4. As a result, the p-type part of anode layer 3 having low concentration immediately under n-type impurity diffusion region 11 serves as a resistance against current passed from anode layer 3 to field limiting innermost circumferential layer 4. Therefore, as compared to the case in which only anode layer 3 is provided in the absence of impurity diffusion region 11, the density of current passed from the bottom side of field limiting innermost circumferential layer 4 toward cathode layer 2 when a forward bias is applied may be reduced. Thus, the concentration of locally great recovery current passed between cathode layer 2 and field limiting innermost circumferential layer 4 caused when a reverse bias is applied may be restrained. Consequently, destruction by heat in the vicinity of field limiting innermost circumferential layer 4 caused by a temperature rise in the vicinity by recovery current may be restrained.

Fifth Embodiment

Figure 11:
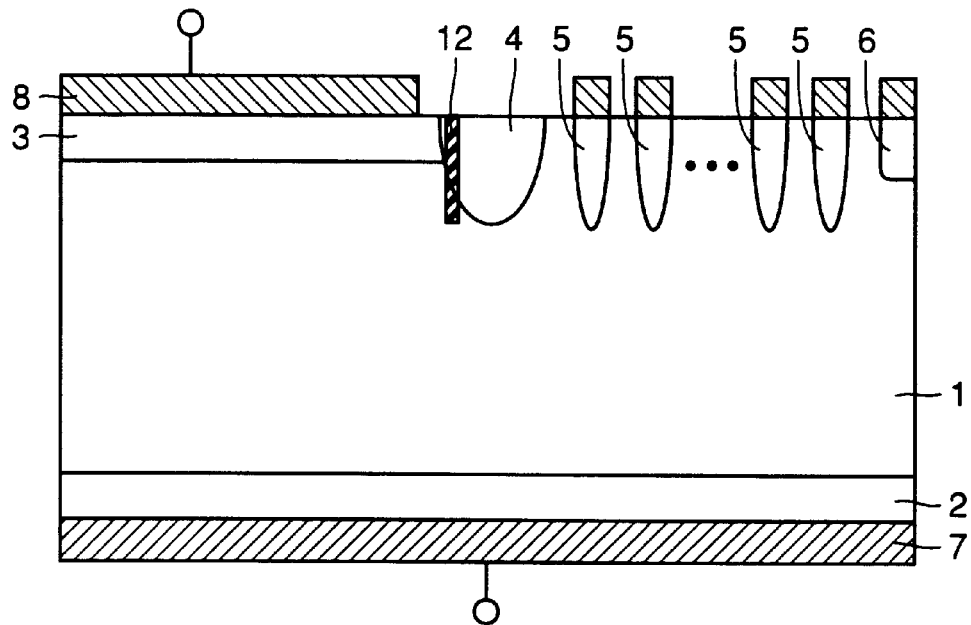

An FWD according to a fifth embodiment of the present invention will be now described in conjunction with FIG. 11. A top view of the FWD according to this embodiment seen from the surface of the semiconductor substrate is substantially the same as that in FIG. 16. A cross section taken along line x—x in the plan view of the FWD as shown in FIG. 16 is given in FIG. 11. The FWD according to this embodiment includes a semiconductor substrate 1, a cathode layer 2, an anode layer 3, a field limiting innermost circumferential layer 4, a field limiting layer 5, a stopper channel layer 6, and a cathode electrode metal layer 7 as is the case with the FWD according to the first embodiment. In the FWD according to this embodiment, anode electrode metal layer 8 extends up to the outermost circumference of anode layer 3, and there is provided an oxide film 12 formed to fill a trench at the boundary part of anode layer 3 and field limiting innermost circumferential layer 4, unlike the FWD according to the first embodiment.

Thus, since insulating layer 12 filled within the trench is formed between anode layer 3 and field limiting innermost circumferential layer 4, insulating 12 insulates against current passed from anode layer 3 to field limiting innermost circumferential layer 4, in other words, cuts off current. As a result, when a forward bias is applied, the density of current passed from the bottom of field limiting innermost circumferential layer 4 toward cathode layer 2 may be reduced. As a result, the concentration of locally great recovery current passed when a reverse bias is applied may be restrained. Consequently, destruction by heat in the vicinity of field limiting innermost circumferential layer 4 caused by a temperature rise in the vicinity by recovery current may be restrained.

Also in this case, if anode electrode metal layer 8 is formed about as large as anode layer 3, oxide film 12 filled within the trench may effectively serve as a resistance, current passed from anode electrode metal layer 8 toward cathode electrode metal layer 7 may be evenly distributed in the width-wise direction as the voltage applied across the region between the anode electrode metal layer 8 and cathode layer 2 is the same. As a result, the current/voltage characteristics between anode electrode metal layer 8 and cathode electrode metal layer 7 may be improved.

Sixth Embodiment

Figure 12:
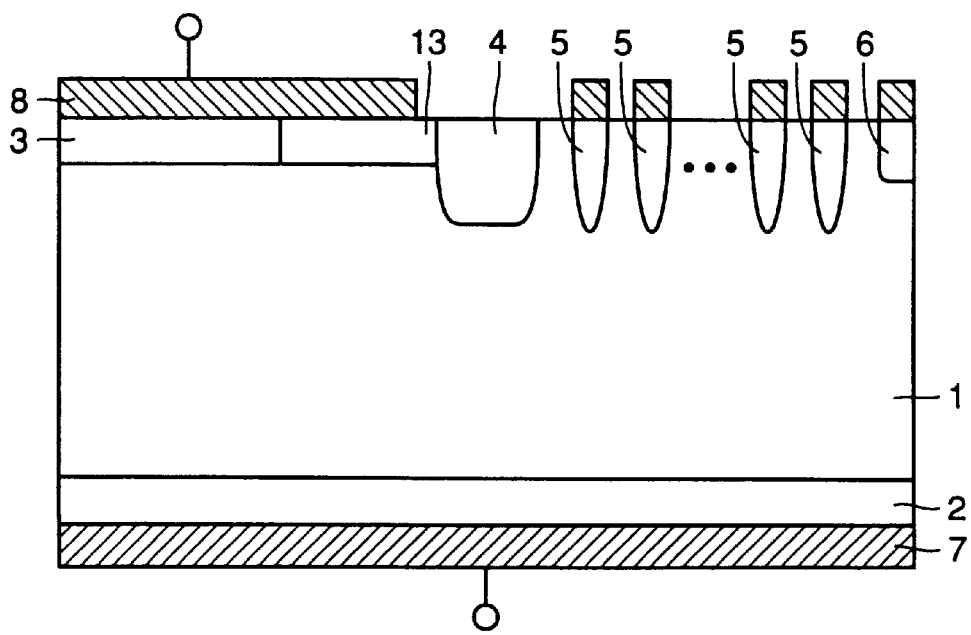

An FWD according to a sixth embodiment of the present invention will be now described in conjunction with FIG. 12. A top view of the FWD according to this embodiment seen from the surface of the semiconductor substrate is the same as that in FIG. 16. A cross section taken along line x—x in the top view of the FWD as shown in FIG. 16 is given in FIG. 12. The FWD according to this embodiment includes a semiconductor substrate 1, a cathode layer 2, a field limiting innermost circumferential layer 4, a field limiting layer 5, a stopper channel 6, and a cathode electrode metal layer 7 as is the case with the FWD according to the first embodiment. The length of anode layer 3 in the radial direction is short, a p-type impurity diffusion region 13 having a depth approximately equal to the depth of anode layer 3 from the main surface and a relatively low concentration is provided between anode layer 3 and field limiting innermost circumferential layer 4. Anode electrode metal layer 8 is provided up to the inner side of field limiting innermost circumferential layer 4, unlike the FWD according to the first embodiment.

Thus, since p-type impurity diffusion region 13 having a relatively low concentration is formed between anode layer 3 and field limiting innermost circumferential layer 4, when a forward bias is applied, impurity diffusion region 13 serves as a resistance against current passed from anode layer 3 to field limiting innermost circumferential layer 4. As a result, as compared to the case in which only anode layer 3 is provided in the absence of impurity diffusion region 13, the density of current passed from the bottom side of field limiting innermost circumferential layer 4 to cathode layer 2 may be reduced. Therefore, the concentration of locally great recovery current generated between cathode layer 2 and field limiting innermost circumferential layer 4 when a reverse bias is applied may be restrained. As a result, destruction by heat in the vicinity of field limiting innermost circumferential layer 4 caused by a temperature rise in the vicinity by recovery current may be restrained.

Seventh Embodiment

Figure 13:
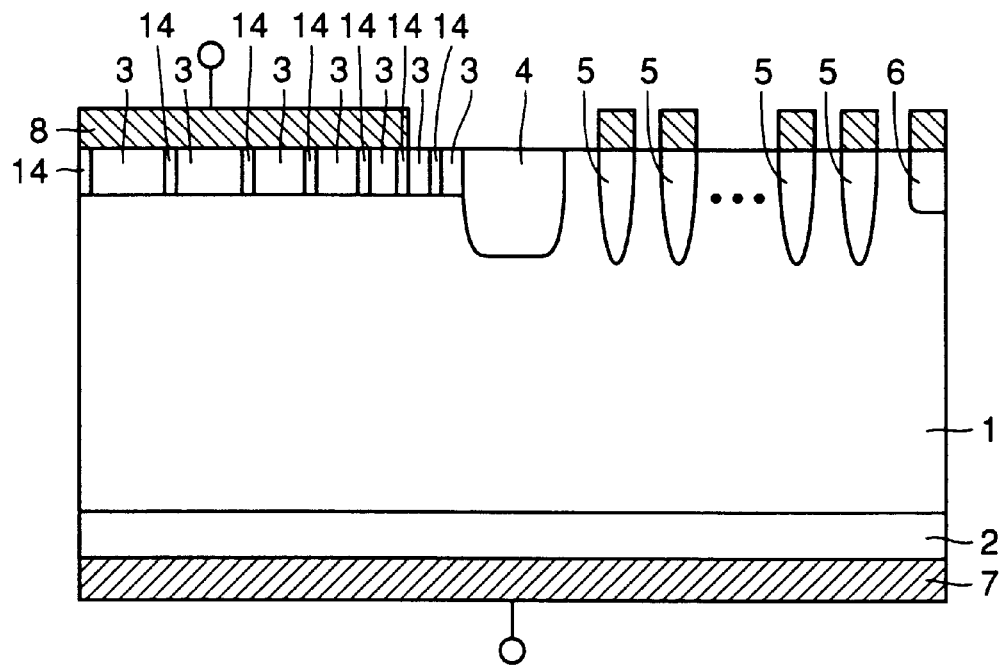

An FWD according to a seventh embodiment of the present invention will be now described in conjunction with FIG. 13. A top view of the FWD according to this embodiment seen from the surface of the semiconductor substrate is the same as that in FIG. 16. A cross section taken along line x—x in the top view of the FWD as shown in FIG. 16 is as given in FIG. 13. The FWD according to this embodiment includes a semiconductor substrate 1, a cathode layer 2, a field limiting innermost circumferential layer 4, a field limiting layer 5, a stopper channel layer 6, a cathode electrode metal layer 7, and a anode electrode metal layer 8, as is the case with the FWD according to the first embodiment. The FWD according to this embodiment includes a plurality of p-type impurity diffusion regions 14 of a relatively low concentration at prescribed intervals in anode layer 3 from the center toward the outermost peripheral part.

Thus, since the plurality of p-type impurity diffusion regions 14 of the relatively low concentration is formed in anode layer 3, when a forward bias is applied, impurity diffusion regions 14 serve as a resistance against current passed from anode layer 3 to field limiting innermost circumferential layer 4. As a result, as compared to the case in which only anode layer 3 is formed in the absence of impurity diffusion region 14, the density of current passed from the bottom side of field limiting innermost circumferential layer 4 toward cathode layer 2 may be reduced. Thus, when a reverse bias is applied, the concentration of locally great recovery current passed between cathode layer 2 and field limiting innermost circumferential layer 4 may be restrained. Consequently, destruction by heat in the vicinity of field limiting innermost circumferential layer 4 caused by a temperature rise in the vicinity may be restrained.

Also in this case, if anode electrode metal layer 8 is formed about as large as anode layer 3, p-type impurity diffusion region 14 of the relatively low concentration may effectively serve as a resistance, and current passed from anode electrode metal layer 8 to cathode layer metal layer 7 may be distributed evenly in the width-wise direction of semiconductor substrate 1 while the voltage applied across the region between anode electrode metal layer 8 and cathode electrode metal layer 7 is the same. As a result, the current/voltage characteristic between anode electrode metal layer 8 and cathode electrode metal layer 7 may be improved.

Eighth Embodiment

Figure 14:
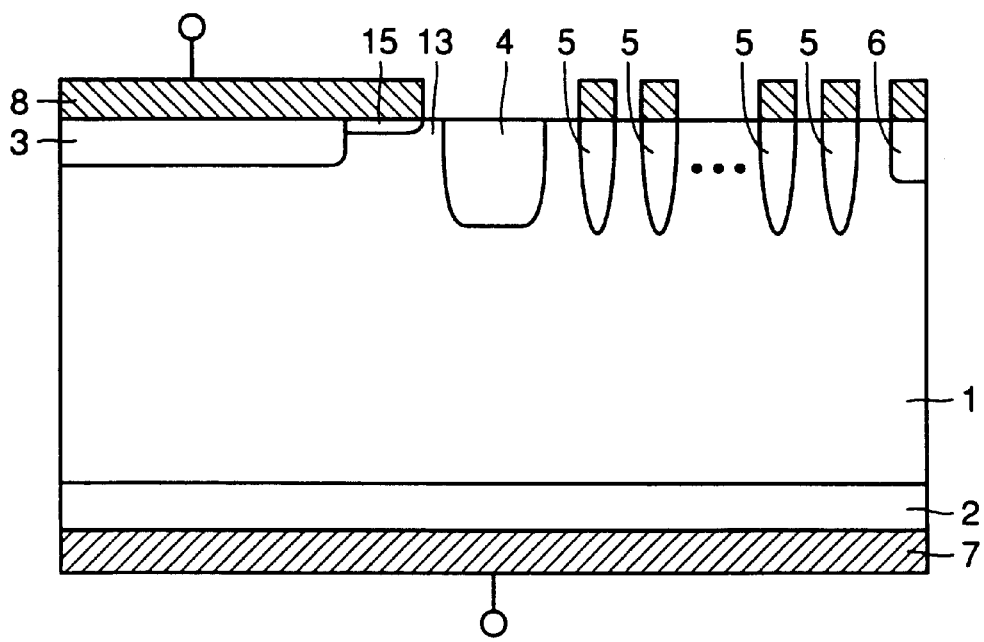

An FWD of an eighth embodiment of the present invention will be now described in conjunction with FIG. 14. A plan view of the FWD according to this embodiment seen from the surface of the semiconductor substrate is the same as that in FIG. 16. A cross section taken along line x—x in the plan view of the FWD as shown in FIG. 16 is given in FIG. 14. The FWD according to this embodiment includes a semiconductor substrate 1, a cathode layer 2, a field limiting innermost circumferential layer 4, a field limiting layer 5, a stopper channel layer 6, and a cathode electrode metal layer 7 as is the case with the FWD according to the first embodiment. In the FWD according to this embodiment, the length of anode layer 3 in the radial direction is short, and a p-type impurity diffusion region 15 of a relatively low concentration and having a depth from the main surface shallower than anode layer 3 is provided between anode layer 3 and field limiting innermost circumferential layer 4. In the FWD according to this embodiment, anode electrode metal layer 8 is provided up to the inner side surface of field limiting innermost circumferential layer 4, unlike the FWD according to the first embodiment.

Thus, p-type impurity diffusion region 15 of the relatively low concentration and having a depth smaller than anode layer 3 is formed between anode layer 3 and field limiting innermost circumferential layer 4. As a result, when a forward bias is applied, impurity diffusion region 15 hardly allows current from anode layer 3 to field limiting innermost circumferential layer 4. Therefore, the density of current passed from the bottom of field limiting innermost circumferential layer 4 to cathode layer 2 may be reduced. Thus, when a reverse bias is applied, the concentration of locally great recovery current passed between cathode layer 2 and field limiting innermost circumferential layer 4 may be restrained. As a result, destruction by heat in the vicinity of field limiting innermost circumferential layer 4 caused by a temperature rise in the vicinity by recovery current may be restrained.

Since anode electrode metal layer 8 is formed up to the vicinity of the inner surface of field limiting innermost circumferential layer 4, the concentration of electric field between anode layer 3 and field limiting innermost circumferential layer 4 may be restrained.

Ninth Embodiment

Figure 15:
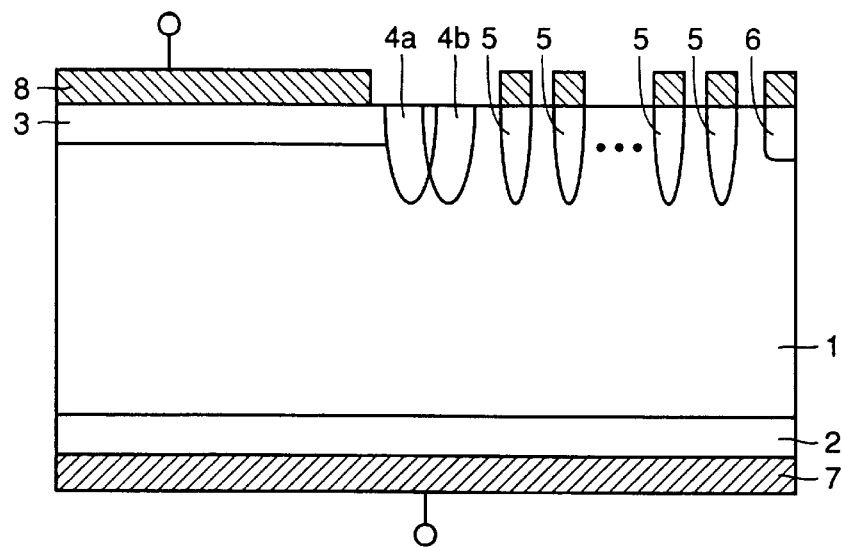

An FWD according to a ninth embodiment of the present invention will be now described in conjunction with FIG. 15. A plan view of the FWD according to this embodiment seen from the surface of the semiconductor substrate is the same as that in FIG. 16. A cross section taken along line x—x in the plan view of the FWD as shown in FIG. 16 is given in FIG. 15. The FWD according to this embodiment includes a semiconductor substrate 1, a cathode layer 2, and an anode layer 3, a field limiting layer 5, a stopper channel layer 6, and a cathode electrode metal layer 7 as is the case with the first embodiment. In the FWD according to this embodiment, anode electrode metal layer 8 extends up to the vicinity of the outermost circumference of anode layer 3, and field limiting innermost circumferential layer 4 is divided into a inner side part 4a and an outer side 4b such that a low concentration part is formed in the center, unlike the FWD according to the first embodiment.

Thus, inner side part 4a and outer side part 4b have a relatively low concentration part therebetween. Inner side part 4a and outer side part 4b have a relatively smaller hole density than the case in which inner side part 4a and outer side 4b do not have such a relatively low concentration part in the central part in the width-direction but is distributed in a constant concentration. As a result, the density of current passed from field limiting innermost circumferential layer 4 to cathode electrode 2, when a forward bias is applied is relatively small. As a result, when a reverse bias is applied, the concentration of locally great recovery current passed between cathode layer 2 and field limiting innermost circumferential layer 4 may be restrained. Consequently, destruction by heat in the vicinity of the inner side part 4a and outer side part 4b of field limiting innermost circumferential layer 4 caused by a temperature rise in the vicinity may be restrained.

Since inner side part 4a and outer side part 4b have a width and an implantation depth in the deepest part identical to the conventional cases, and equipotential surfaces are the same as the conventional cases, the effect of relaxing the concentration of electric field will not be decreased, unlike the case of reducing the implantation depth to reduce the hole density.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate of a first conductivity type;

a first impurity region of a second conductivity type, formed from a first main surface of said semiconductor substrate to a prescribed depth;

an annular second impurity diffusion region of the second conductivity type formed in said first main surface in a region outside and around said first impurity diffusion region, having a depth from said main surface greater than that of the first impurity diffusion region and a concentration higher than the first impurity diffusion region, said first impurity diffusion region in contact with said second impurity diffusion region;

a first metal layer provided in contact with said first impurity diffusion region on said first main surface of said semiconductor substrate at a prescribed distance from the innermost circumference of said second impurity diffusion region; and a second metal layer provided in contact with a second main surface of said semiconductor substrate.

2. The semiconductor device as recited in claim 1, wherein the semiconductor further comprising a third impurity diffusion region of the first conductivity type provided between said first impurity diffusion region and said second impurity diffusion region, two-dimensionally in contact with the inner side of said second impurity diffusion region and having an implantation depth smaller than said first impurity diffusion region.

3. A semiconductor device comprising:

a semiconductor substrate of a first conductivity type;

a first impurity region of a second conductivity type, formed from a first main surface of said semiconductor substrate to a prescribed depth;

an annular second impurity diffusion region of the second conductivity type formed in said first main surface in a region outside and around said first impurity diffusion region, having a depth from said main surface greater than that of the first impurity diffusion region and a concentration higher than the first impurity diffusion region, the outermost circumference of said first impurity diffusion region and the innermost circumference of said second impurity diffusion region are provided a prescribed distance apart from each other;

a first metal layer provided in contract with said first impurity diffusion region on said first main surface of said semiconductor substrate at a prescribed distance from the innermost circumference of said second impurity diffusion region;

a second metal layer provided in contact with a second main surface of said semiconductor substrate; and, a third metal layer provided on said first main surface of said semiconductor substrate with an insulating film interposed therebetween, said third metal layer in contact with the outermost circumference of said first metal layer and formed around and surrounding said first metal layer, said third metal layer extending radially to about, but not over, the innermost circumference of the second impurity diffusion region.

4. A semiconductor device comprising:

a semiconductor substrate of a first conductivity type;

a first impurity region of a second conductivity type, formed from a first main surface of said semiconductor substrate to a prescribed depth;

an annular second impurity diffusion region of the second conductivity type formed in said first main surface in a region outside and around said first impurity diffusion region, having a depth from said main surface greater than that of the first impurity diffusion region and a concentration higher than the first impurity diffusion region, the outermost circumference of said first impurity region and the innermost circumference of said second impurity diffusion region are provided a prescribed distance apart from each other so as not to be in contact with each other;

a first metal layer provided in contract with said first impurity diffusion region on said first main surface of said semiconductor substrate at a prescribed distance from the innermost circumference of said second impurity diffusion region;

a second metal layer provided in contact with a second main surface of said semiconductor substrate; and, an insulating layer provided to cover a region on said first main surface of said semiconductor substrate between the outermost circumference of said first impurity diffusion region and the innermost circumference of said second impurity diffusion region, and a conductive layer covering said insulating layer and connecting said first impurity diffusion region and said second impurity diffusion region, said conductive layer and said first impurity diffusion region in contact.

5. A semiconductor device, comprising:

a semiconductor substrate of a first conductivity type;

a first impurity diffusion region of a second conductivity type formed from a first main surface of said semiconductor substrate to a prescribed depth;

a second impurity diffusion region provided in said first main surface of said semiconductor substrate in a region outside and around said first impurity diffusion region, and having an impurity diffusion depth from said first main surface greater than that of said first impurity diffusion region, a concentration higher that of said first impurity diffusion region, and a prescribed width;

a first metal layer provided in contact with said first impurity diffusion region on said first main surface of said semiconductor substrate;

a second metal layer provided in contact with a second main surface of said semiconductor substrate; and a resistance region in said first impurity diffusion region or in a region between said first and second impurity diffusion regions to serve as a resistance against current flowed from said first impurity diffusion region to said second impurity diffusion region, and having a resistance value higher that of said first impurity diffusion region, said resistance region is a sixth impurity diffusion region of the second conductivity type, provided between said first and second impurity diffusion regions at a prescribed distance from the innermost circumference of said second impurity diffusion region, and having an impurity implantation depth smaller than that of said first impurity diffusion region and a concentration lower that of said first impurity diffusion region.

6. A semiconductor device, comprising:

a semiconductor substrate of a first conductivity type;

a first impurity diffusion region of a second conductivity type formed from a first main surface of said semiconductor substrate to a prescribed depth;

a second impurity diffusion region provided in said first main surface of said semiconductor substrate in a region outside and around said first impurity diffusion region, and having an impurity diffusion depth from said first main surface greater than that of said first impurity diffusion region, a concentration higher that of said first impurity diffusion region, and a prescribed width;

a first metal layer provided in contact with said first impurity diffusion region on said first main surface of said semiconductor substrate;

a second metal layer provided in contact with a second main surface of said semiconductor substrate; and a resistance region in said first impurity diffusion region or in a region between said first and second impurity diffusion regions to serve as a resistance against current flowed from said first impurity diffusion region to said second impurity diffusion region, and having a resistance value higher that of said first impurity diffusion region, said resistance region is a region formed by filling an insulating film within a trench formed from said first main surface of said semiconductor substrate to a prescribed depth in a boundary region between said first and second impurity diffusion regions.

7. A semiconductor device, comprising:

a semiconductor substrate of a first conductivity type;

a first impurity diffusion region of a second conductivity type formed from a first main surface of said semiconductor substrate to a prescribed depth;

a second impurity diffusion region provided in said first main surface of said semiconductor substrate in a region outside and around said first impurity diffusion region, and having an impurity diffusion depth from said first main surface greater than that of said first impurity diffusion region, a concentration higher that of said first impurity diffusion region, and a prescribed width;

a first metal layer provided in contact with said first impurity diffusion region on said first main surface of said semiconductor substrate;

a second metal layer provided in contact with a second main surface of said semiconductor substrate; and a resistance region in said first impurity diffusion region or in a region between said first and second impurity diffusion regions to serve as a resistance against current flowed from said first impurity diffusion region to said second impurity diffusion region, and having a resistance value higher that of said first impurity diffusion region, said resistance region is a fourth impurity diffusion region of the second conductivity type formed between said first and second impurity diffusion regions and having a concentration lower than said first impurity diffusion region, said fourth impurity region in contact with said first metal layer.

8. A semiconductor device, comprising:

a semiconductor substrate of a first conductivity type;

a first impurity diffusion region of a second conductivity type formed from a first main surface of said semiconductor substrate to a prescribed depth;

a second impurity diffusion region provided in said first main surface of said semiconductor substrate in a region outside and around said first impurity diffusion region, and having an impurity diffusion depth from said first main surface greater than that of said first impurity diffusion region, a concentration higher that of said first impurity diffusion region, and a prescribed width;

a first metal layer provided in contact with said first impurity diffusion region on said first main surface of said semiconductor substrate;

a second metal layer provided in contact with a second main surface of said semiconductor substrate; and a resistance region in said first impurity diffusion region or in a region between said first and second impurity diffusion regions to serve as a resistance against current flowed from said first impurity diffusion region to said second impurity diffusion region, and having a resistance value higher that of said first impurity diffusion region, said resistance region is a plurality of annular fifth impurity diffusion regions of the second conductivity type, formed from said first main surface of said semiconductor substrate to a prescribed depth in said first impurity diffusion region, from about center of said first impurity diffusion region to surround the center and having a concentration lower than that of said second impurity diffusion region.

9. A semiconductor device, comprising:

a semiconductor substrate of a first conductivity type;

a first impurity region of a second conductivity type, formed from a first main surface of said semiconductor substrate to a prescribed depth;

an annular second impurity diffusion region of the second conductivity type, provided in said first main surface of said semiconductor substrate in a region outside and around said first impurity diffusion region, and having a depth from said main surface greater than that of said first impurity diffusion region, a prescribed width, and an impurity concentration in the vicinity of a central part in the width-direction lower than the outermost and innermost circumferences;

a first metal layer, provided on said first main surface of said semiconductor substrate to be adjacent with said second impurity diffusion region; and a second metal layer, provided in contact with a second main surface of said semiconductor substrate.

* * * * *